(12) United States Patent
Schoner et al.

(10) Patent No.: US 11,923,450 B2
(45) Date of Patent: Mar. 5, 2024

(54) MOSFET IN SIC WITH SELF-ALIGNED LATERAL MOS CHANNEL

(71) Applicant: II-VI Delaware, Inc., Wilmington, DE (US)

(72) Inventors: Adolf Schoner, Hasselby (SE); Sergey Reshanov, Upplands Vasby (SE); Nicolas Thierry-Jebali, Stockholm (SE); Hossein Elahipanah, Sollentuna (SE)

(73) Assignee: II-VI ADVANCED MATERIALS, LLC, Pine Brook, NJ (US)

( * ) Notice: Subject to any disclaimer, the term of this patent is extended or adjusted under 35 U.S.C. 154(b) by 0 days.

(21) Appl. No.: 17/817,384

(22) Filed: Aug. 4, 2022

(65) Prior Publication Data

US 2022/0376107 A1 Nov. 24, 2022

Related U.S. Application Data

(63) Continuation of application No. 17/256,952, filed as application No. PCT/EP2019/067432 on Jun. 28, 2019, now Pat. No. 11,444,192.

(30) Foreign Application Priority Data

Jun. 29, 2018 (SE) .................................... 1850824-2

(51) Int. Cl.
*H01L 29/78* (2006.01)
*H01L 21/04* (2006.01)
(Continued)

(52) U.S. Cl.
CPC ...... *H01L 29/7805* (2013.01); *H01L 21/0465* (2013.01); *H01L 29/063* (2013.01);
(Continued)

(58) Field of Classification Search
CPC . H01L 29/0623; H01L 29/063; H01L 29/086; H01L 29/0878; H01L 29/1095;
(Continued)

(56) References Cited

U.S. PATENT DOCUMENTS

2016/0190308 A1* 6/2016 Konstantinov ....... H01L 29/167 257/77
2017/0012119 A1* 1/2017 Konstantinov ....... H01L 21/047
(Continued)

OTHER PUBLICATIONS

International Search Report and Written Opinion from PCT Appl. PCT/EP2019/067432, dated Sep. 20, 2019, 9-pgs.

*Primary Examiner* — Fazli Erdem
(74) *Attorney, Agent, or Firm* — Blank Rome LLP

(57) ABSTRACT

There is disclosed a method for manufacturing a MOSFET with lateral channel in SiC, said MOSFET comprising simultaneously formed n type regions comprising an access region and a JFET region defining the length of the MOS channel, and wherein the access region and the JFET region are formed by ion implantation by using one masking step. The design is self-aligning so that the length of the MOS channel is defined by simultaneous creating n-type regions on both sides of the channel using one masking step. Any misalignment in the mask is moved to other less critical positions in the device. The risk of punch-through is decreased compared to the prior art. The current distribution becomes more homogenous. The short-circuit capability increases. There is lower Drain-Source specific on-resistance due to a reduced MOS channel resistance. There is a lower JFET resistance due to the possibility to increase the JFET region doping concentration.

20 Claims, 22 Drawing Sheets

(51) Int. Cl.
*H01L 29/06* (2006.01)
*H01L 29/10* (2006.01)
*H01L 29/16* (2006.01)
*H01L 29/66* (2006.01)

(52) U.S. Cl.
CPC ...... *H01L 29/1095* (2013.01); *H01L 29/1608* (2013.01); *H01L 29/66068* (2013.01)

(58) Field of Classification Search
CPC ........... H01L 29/1608; H01L 29/66068; H01L 29/7802; H01L 29/7805; H01L 29/7806; H01L 21/046; H01L 21/0465
USPC ......................................................... 257/77
See application file for complete search history.

(56) References Cited

U.S. PATENT DOCUMENTS

| | | |
|---|---|---|
| 2017/0229541 A1 | 8/2017 | Nakamura et al. |
| 2017/0301789 A1 | 10/2017 | Takei et al. |
| 2022/0376107 A1* | 11/2022 | Schoner ................ H01L 29/063 |

* cited by examiner (Prior Art)

(Prior Art)

1 MOSFET cell between PN body diode feeders

Several MOSFET cell between PN body diode feeders

Prior art DMOSFET: Layout example

P-well is part ot PN-body diode, each MOSFET cell contains a PN body diode contact

MOSFET IN SIC WITH SELF-ALIGNED LATERAL MOS CHANNEL

CROSS-REFERENCE TO RELATED APPLICATIONS

This is a continuation of U.S. application Ser. No. 17/256,952 filed Dec. 29, 2020, which is a national stage of PCT/EP2019/067432 filed Jun. 28, 2019, which claims priority to Swedish Patent Appl. No. 1850824-2 filed Jun. 29, 2018, the contents of which are each relied upon and incorporated herein by reference in their entireties.

TECHNICAL FIELD

The present invention relates to a MOSFET in SiC, which is made so that a lateral channel region has a length, which is defined in one manufacturing step.

BACKGROUND

The SiC MOSFET technology is missing a reliable process to define the lateral channel region and control the channel length, which technology at the same time is practical to use. In the state of the art the lateral channel region is usually the region between an n+ source and a JFET region, both formed by separate mask steps. Typically a MOSFET is made up of a plurality of cells. Typically one cell comprises one or two lateral MOS channels. The different regions in the material are normally made using masks. The channel length depends on the accuracy and alignment of the different mask layers. In such a MOSFET the channel length can vary within a cell and from cell to cell due to misalignment and other factors. Mask misalignment can cause asymmetrical channel regions leading to weak points, stress, and reliability issues. To avoid it, extra process and lithography steps are used to overcome such issues. It is desirable to reduce the variability in the channel length.

SiC MOSFETs are regarded to replace Si-IGBTs in applications. But, the short-circuit capability of SiC power MOSFETs is as today typically lower than for Si-IGBTs mainly due to a concentration of the resistance to the sensitive MOS channel having a relatively low channel mobility.

Lateral channel SiC MOSFETs with rather high channel mobility can be realized by low p-well doping concentration ($<5e17/cm^3$) in the MOS channel region, while higher p-well doping concentration ($>1\ e18/cm^3$) is required in non-channel p-well regions to avoid punch-through and reduced voltage blocking capability.

In applications, the integrated body diode (pn-diode of p-well to drain) of the MOSFET is often used as freewheeling diode in circuits. The performance of the pn-body diode in SiC is limited due to the p-well thickness and doping concentration required for the desired MOSFET operation. The p-well emitter is not very effective and carrier injection into the drift region is limited.

The diffusion of standard doping elements into SiC is limited. Hence, doping profiles are formed by several implants with specific dose and energy at elevated temperatures. Deep doping profiles are formed by high energy implantations and high concentrations are achieved by implanting high doses. High energy and high dose implantation is a very expensive process and creates damage in the material so that complete damage removal by high temperature treatment is difficult.

Remaining damage limits the carrier injection. For high current density in third quadrant operation (body diode in forward), the so-called bipolar degradation can occur due to the generation of single Shockley stacking faults by carrier recombination in the vicinity of the implanted p+ emitter. This stacking fault generation results in an increase of the differential resistance and generates reliability issues. V. Soler et al. in IEEE TRANSACTIONS ON INDUSTRIAL ELECTRONICS, VOL 64, NO. 11, NOVEMBER 2017 High-voltage 4H-SiC power MOSFETs with boron-doped gate oxide demonstrates high-voltage 4H-SiC MOSFETs with n-doped region by the n+ source to improve the device performance. This is aimed at improving the short-circuit capability of SiC power MOSFETs. The p-well region has however no protection and thus its minimum doping concentration is limited by the high electric field. In addition, the doping concentration and length of the JFET region is limited by the high electric field from the drift region. This increases the on-resistance and limits the on-state performance of the device.

U.S. Pat. No. 6,091,108 proposes a buried grid as a shielding region for the sensitive part of the high voltage devices. This is aimed at improving the channel mobility and to improve the performance of the pn-body diode. High energy and high dose implantation is avoided. It is also seeking to address problems with bipolar degradation for body diodes in forward. Harada et al. in Electron Devices Meeting 2006, IEDM '06 International, 1.8 mOhm $cm^2$, 10A Power MOSFET in 4H-SiC, fabricates the MOSFET structure by combining implanted (P+) and epitaxial (P−) p-well to improve channel mobility. High energy and high dose implantation is avoided. It is also seeking to address problems with bipolar degradation for body diodes in forward.

U.S. Pat. No. 7,381,992 proposes the self-aligned formation of source and well regions by successively widening the openings in one and the same implantation mask before the source and well implantations. This aims at addressing problems with mask misalignment, which may cause asymmetrical channel regions leading to weak points, stress, and reliability issues. The technology is dependent on very good process control.

Advanced High Voltage Power Device Concepts by B. J. Baliga, 2012, chapter 6 SiC planar MOSFET structures, describes a shielded planar SiC accumulation mode MOSFET. The aim of this technology is also to improve the channel mobility.

U.S. Pat. No. 7,728,336 discloses MOSFET in SiC comprising a channel region and an n-type inverted electron guide path formed through ion implantation in a low-concentration p-type deposition film. The invention seeks to counteract that the width of the channel region may be partly narrowed owing to implantation mask positioning failure, which could impair the properties. In U.S. Pat. No. 7,728,336 the second inverted layers (41, 42) are provided at the same distance on the right and left sides from the inverted layer (40) to be the electron guide path in the device, and the inverted layers are formed through simultaneous ion implantation using the same mask, and accordingly, the length of all the channel regions in the device is made uniform, thereby solving the problem.

A problem in the prior art including U.S. Pat. No. 7,728,336 is that remains a risk for punch-through, which increases the output conductance and limits the maximum operating voltage of the device. Another problem in the prior art is that there is a risk of short-circuit where the source is in direct contact with an n-layer if the n-layer is not completely depleted.

SUMMARY

It is an object of the present invention to obviate at least some of the disadvantages in the prior art and provide an improved method of manufacturing a MOSFET with lateral channel in SiC.

In a first aspect there is provided a method of manufacturing a MOSFET with lateral channel in SiC, said MOSFET comprising: an n+ substrate (1), an n drift layer (3) in contact with the n+ substrate (1), a p type buried grid (4) in contact with the n drift layer (3), a p-well (6), simultaneously formed n type regions (7), an n+ source (8), a p body (9) in contact with the p-well (6) and the p type buried grid (4), an insulating gate oxide (10), a gate contact (11) on the insulating gate oxide (10), an isolation layer (12) over the gate contact (11), a source contact (13) in contact with the n+ source (8), a body diode contact (14) in contact with the p body (9), a drain contact (15) in contact with the n+ substrate (1), wherein the simultaneously formed n type regions (7) comprise an access region (7a) and a JFET region (7b) with a part of the p-well (6) between the access region (7a) and the JFET region (7b) and in contact with the gate oxide (10) defining a MOS channel (17), wherein the access region (7a) is in contact with the n+ source (8), wherein the JFET region (7b) is in contact with the n drift layer (3), or an optional n layer (5) between the n drift layer (3) and the JFET region (7b), wherein the access region (7a) and the JFET region (7b) in the simultaneously formed n type regions (7) are formed by ion implantation by using one masking step, wherein one of the following steps is carried out:
  i. the p-well (6) is made by a process involving ion implantation and the simultaneously formed n type regions (7) are implanted to such a depth that a part of the p-well (6) under the access region (7a) remains, or
  ii. the p-well (6) is made by epitaxial growth not involving ion implantation, wherein at least one selected from a p-well implant (6b) and p type buried grid (4) is between the n drift layer (3) and a region consisting of the p-well (6) as well as the access region (7a).

In a second aspect there is provided a MOSFET with lateral channel in SiC, said MOSFET comprising: an n+ substrate (1), an n drift layer (3) in contact with the n+ substrate (1), a p type buried grid (4) in contact with the n drift layer (3), a p-well (6), simultaneously formed n type regions (7), an n+ source (8), a p body (9) in contact with the p-well (6), an insulating gate oxide (10), a gate contact (11) on the insulating gate oxide (10), an isolation layer (12) on the gate contact (11), a source contact (13) in contact with the n+ source (8), a body diode contact (14) in contact with the p body (9), a drain contact (15) in contact with the n+ substrate (1), wherein the simultaneously formed n type regions (7) comprise an access region (7a) and a JFET region (7b) with a part of the p-well (6) between the access region (7a) and the JFET region (7b) defining a MOS channel (17), wherein the access region (7a) is in contact with the n+ source (8), wherein the JFET region (7b) is in contact with the n drift layer (3), or an optional n layer (5) between the n drift layer (3) and the JFET region (7b), wherein the access region (7a) and the JFET region (7b) in the simultaneously formed n type regions (7) have the same doping concentration and define the length of the MOS channel (17) with a tolerance of ±50 nm or better, wherein the MOSFET satisfies one of:
  i. the p-well (6) is made by a process involving ion implantation and the simultaneously formed n type regions (7) are implanted to such a depth that a part of the p-well (6) under the access region (7a) remains, or
  ii. the p-well (6) is made by epitaxial growth not involving ion implantation, wherein at least one selected from a p-well implant (6b) and p type buried grid (4) is between the n drift layer (3) and a region consisting of the p-well (6) as well as the access region (7a).

Further aspects and embodiments are defined in the appended claims, which are specifically incorporated herein by reference.

Advantages include that the design is self-aligning so that the length of the MOS channel (17) is defined by simultaneous creating n-type regions on both sides of the channel using one masking step so that the precision of the length is determined mainly by the precision of the mask. Using a mask and ion implantation allows to reach a high precision. Inaccuracies are moved to less critical regions in the device. Inaccuracies are moved away from the MOS channel so that they are less important for the end result.

There are also further advantages. The risk of punch-through in MOSFET cells is reduced.

Further, it is possible to control and determine the resistance schematically illustrated as R2, in the access region (7a). This is an advantage in order to limit the source to drain current at increased temperatures.

The risk of source-drain short circuit is reduced compared to the prior art such as U.S. Pat. No. 7,728,336.

The invention gives a number of additional advantages such as the following. The formation of the MOS channel with a self-aligned process results in symmetrical MOS channels and homogeneous current distribution. Both improve the device reliability under stress.

An improved short-circuit capability due to the integration of an n-doped access region with controlled resistance between the n+-source and the MOS channel.

Lower Drain-Source specific on-resistance due to a reduced MOS channel resistance.

A lower JFET resistance due to the possibility to increase the JFET region doping concentration.

A more reliable device by using a highly doped buried grid as p-emitter of the body diode.

An improved emitter efficiency of the body diode resulting in improved 3rd quadrant operation performance.

BRIEF DESCRIPTION OF THE DRAWINGS

The invention is described with reference to the following drawings in which.

DETAILED DESCRIPTION

Figure 1A:
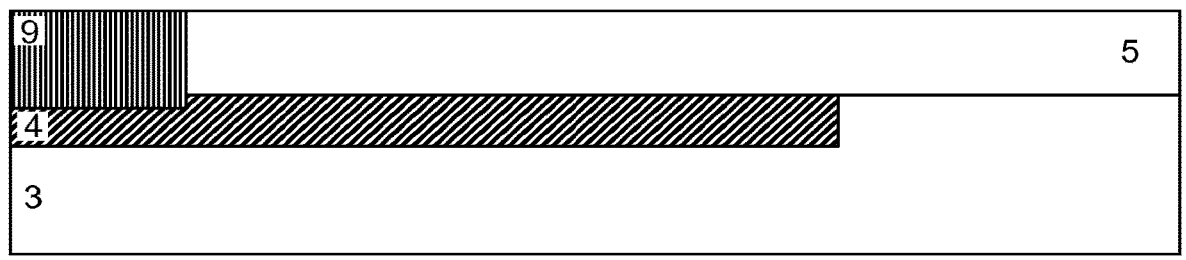
FIGS. 1A-1C show the manufacturing process for a device according to the invention.
Figure 1B:
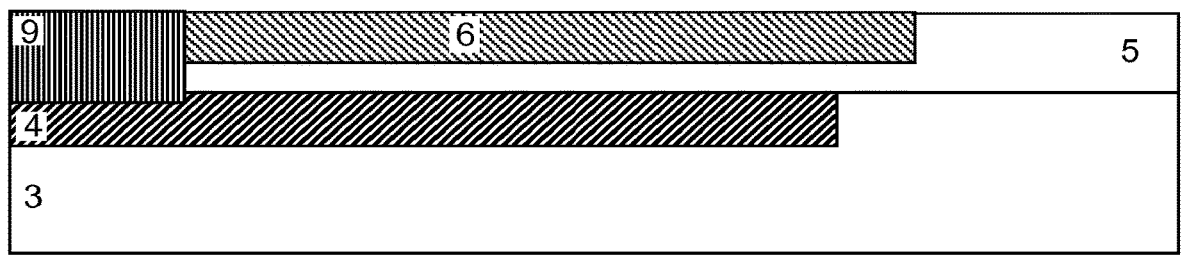
Figure 1C:
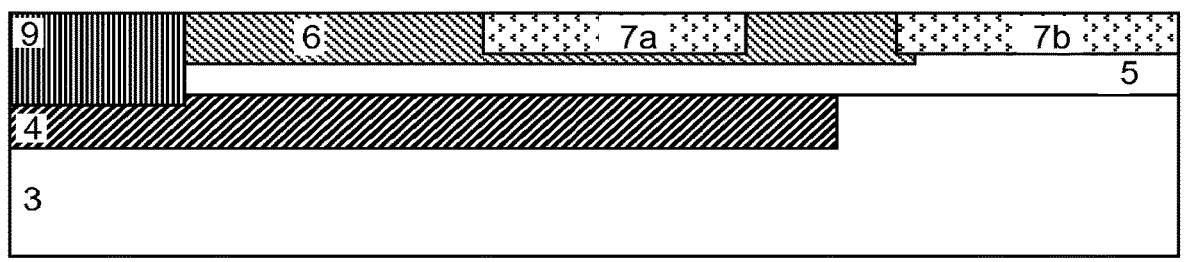

FIGS. 1A-1C show the manufacturing process for a device according to the invention. In the top panel the p-well is formed by selective doping such as ion implantation. In the middle panel the p-well (6) is formed. In the bottom panel the simultaneously formed n type regions (7, 7a, 7b) are formed, i.e. the self aligned channel is formed.

Figure 2A:
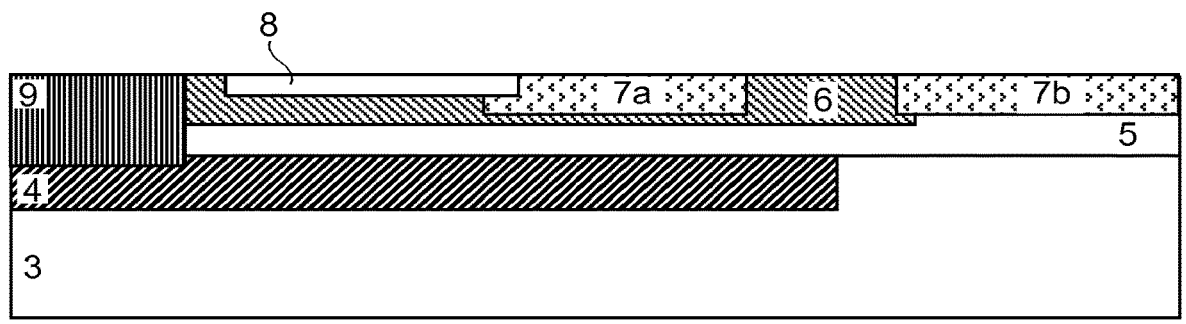
FIGS. 2A-B show the continuation of the manufacturing process from FIGS. 1A-1C.
Figure 2B:
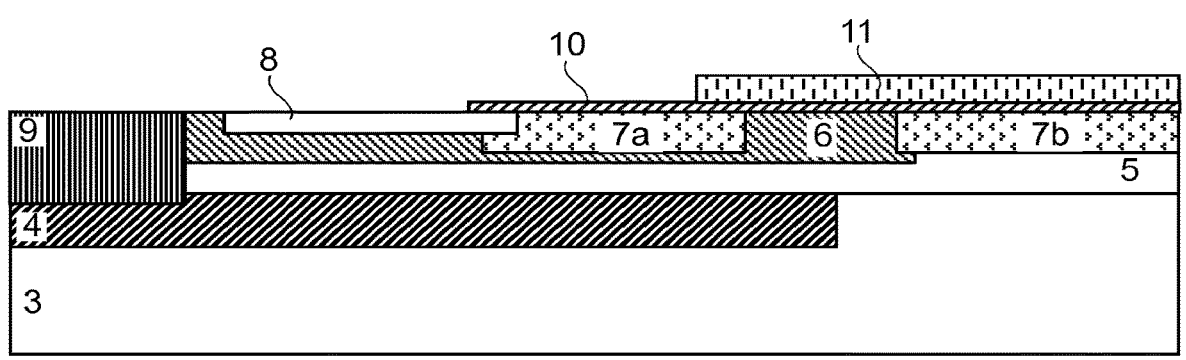

FIGS. 2A-2B show the continuation of the manufacturing process from FIGS. 1A-1C, where the source region (8), the gate oxide (10) and the gate (11) are formed.

Figure 3A:
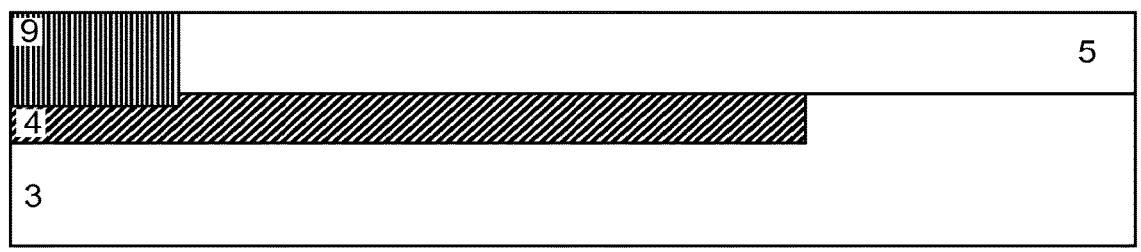
FIGS. 3A-3C show the manufacturing process for a device according to the invention.
Figure 3B:
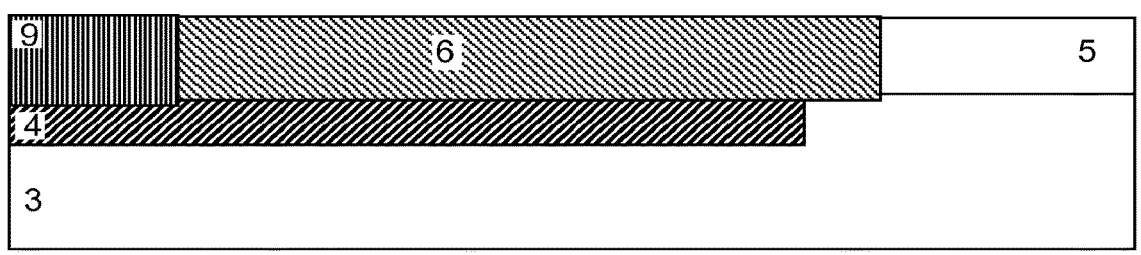
Figure 3C:
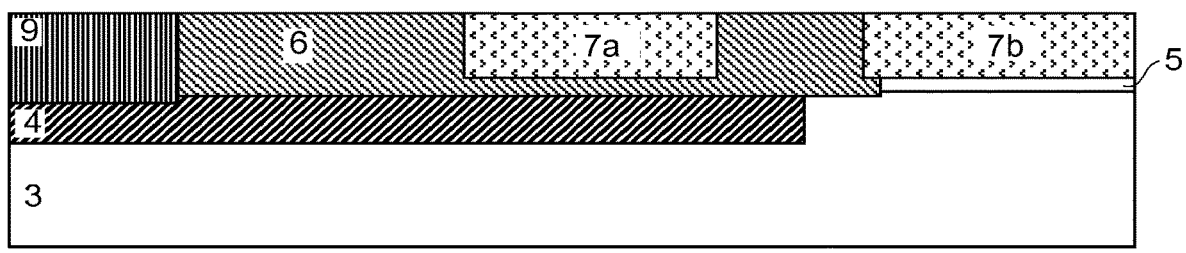

FIGS. 3A-3C show the manufacturing process for a device according to the invention where no other layer is between the p-well (6) and the p type buried grid (4), i.e. the p-well (6) is in contact with the p type buried grid (4). In the top panel the p-well is formed by selective doping such as ion implantation. In the middle panel the p-well (6) is formed. In the bottom panel the simultaneously formed n type regions (7, 7a, 7b) are formed, i.e. the self aligned channel is formed.

Figure 4A:
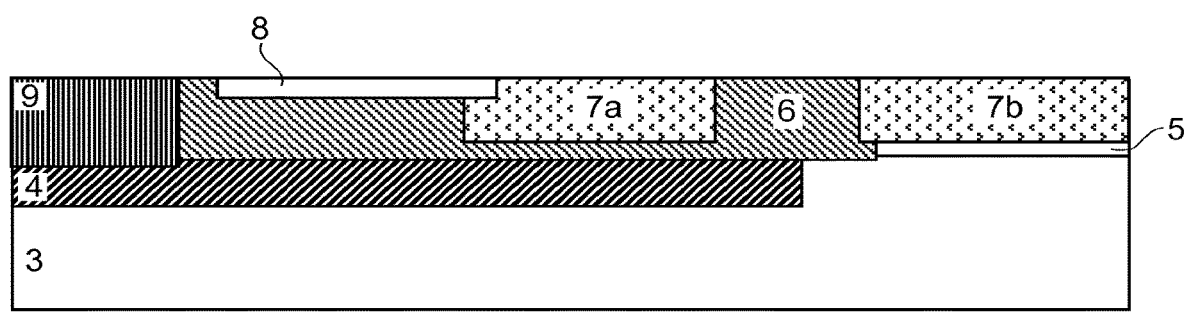
FIGS. 4A-4B show the continuation of the manufacturing process from FIGS. 3A-3C.
Figure 4B:
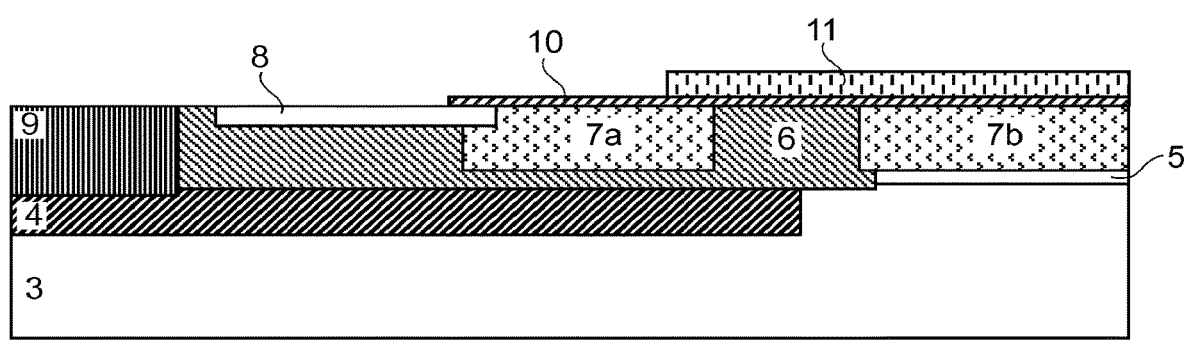
Figure 5A:
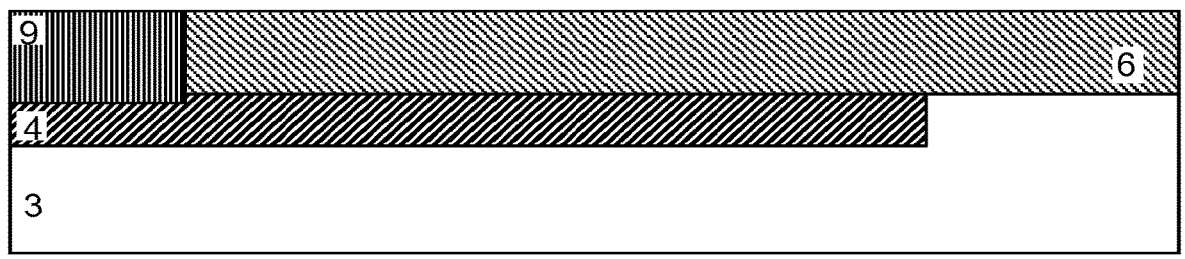
FIGS. 5A-5F show the manufacturing process for two devices according to the invention.
Figure 5B:
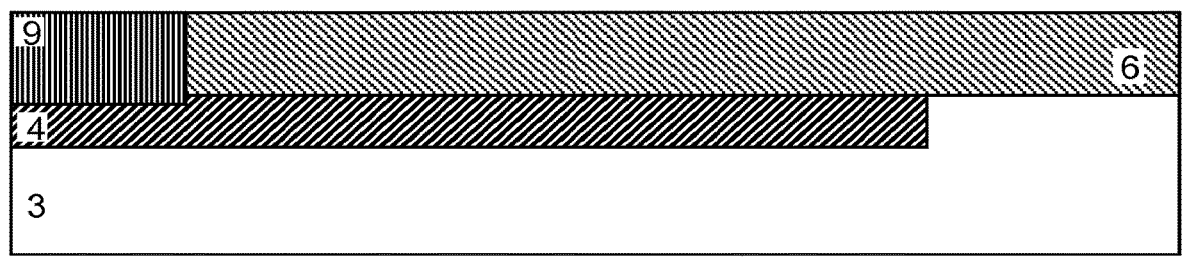
Figure 5C:
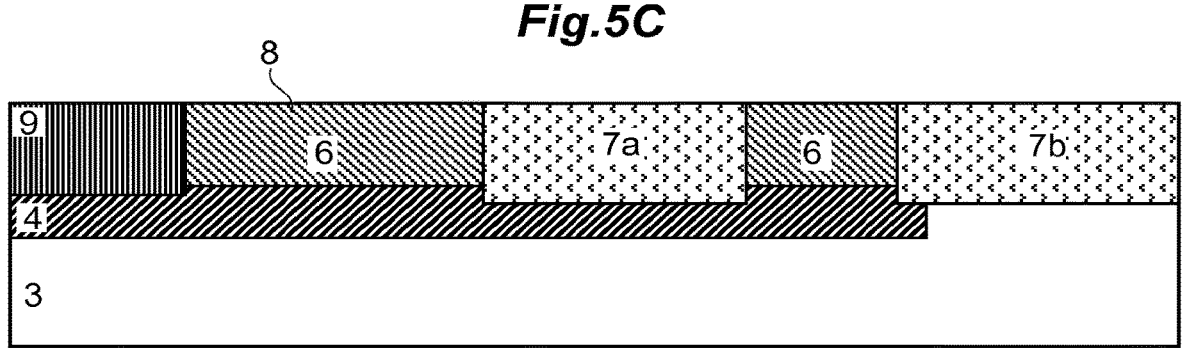
Figure 5D:
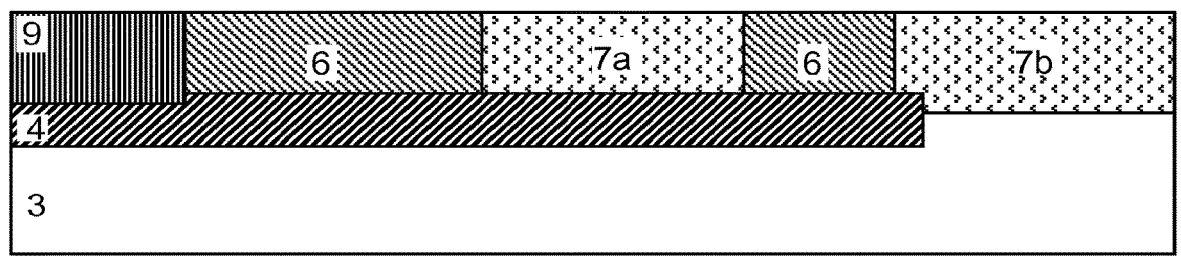
Figure 5E:
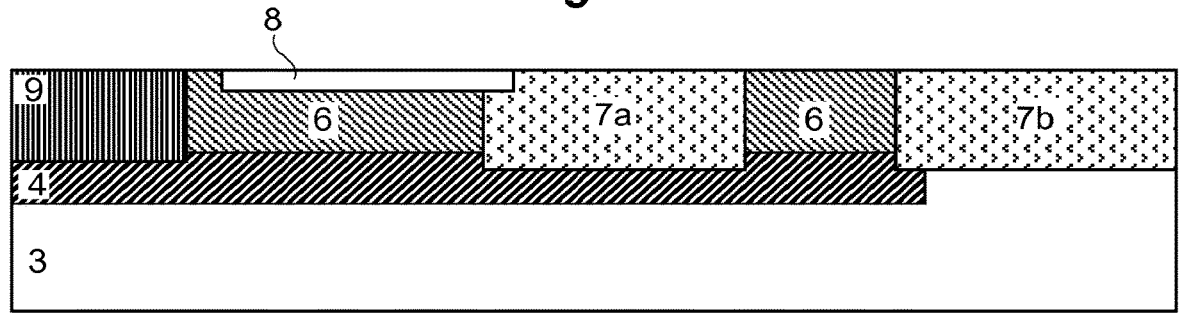
Figure 5F:
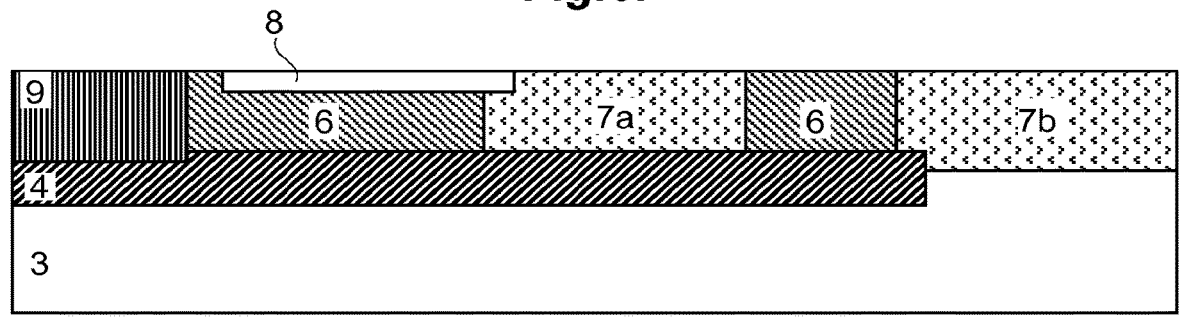

FIGS. 4A-4B show the continuation of the manufacturing process from FIGS. 3A-3C, where the source region, the gate oxide and the gate are formed.

FIGS. 5A-5F show the manufacturing process for two devices according to the invention where the p-well is made by epitaxy and not involve ion implantation. The access region (7a) and the JFET region (7b) has to be implanted deeper than the p-well layer thickness. Hence, the access region (7a) does not have a part of the p-well (6) under it. The p type buried grid (4) covers the entire p-well (6) as well as the access region (7a), so that there is no direct contact between the p-well (6) and the access region (7a) with the n drift layer (3) and hence there is no need for an additional p-well implant (6b) to avoid punch-through. The p-well (6) is formed by non-selective doping such as epitaxial growth. In one embodiment (right panels) the relative doping level in the different regions is: 9>4>7>6. In the left panels the doping level in the lower part of the access region (7a) and in lower part of the JFET region (7b) is higher than in the buried grid (4). In the upper panels the p-well (6) is formed. The p-well (6) is in contact with the p type grid (4). In the middle panel the self aligned channel is formed, i.e. the part of the p-well (6) between the access region (7a) and the JFET region (7b). In the lower panel the source region (8) is formed.

Figure 6A:
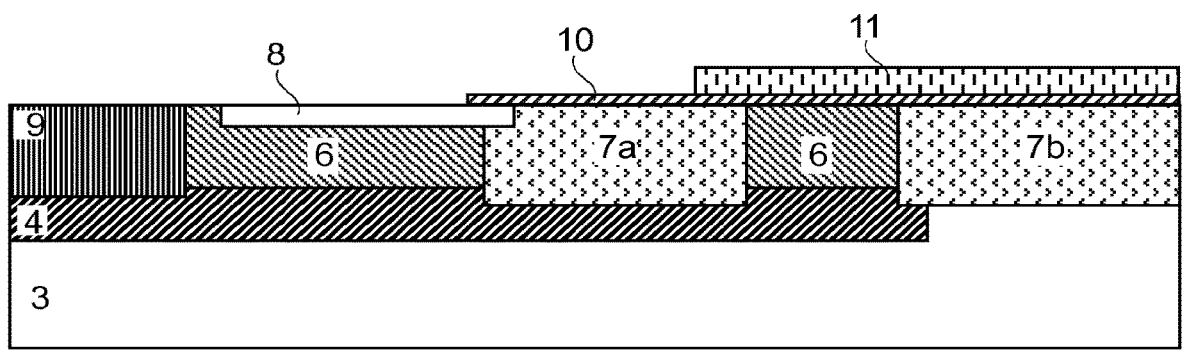
FIGS. 6A-6B show the continuation of the manufacturing process from FIGS. 5A-5F.
Figure 6B:
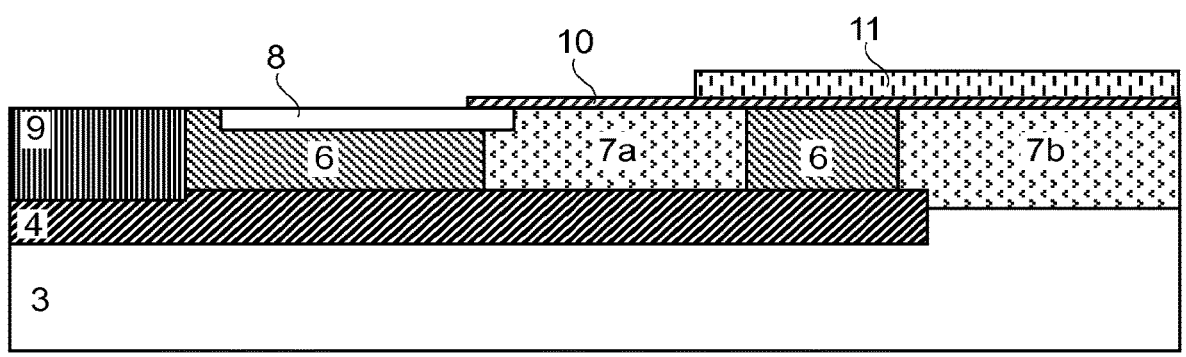

FIGS. 6A-6B show the continuation of the manufacturing process from FIG. 5, where the gate oxide (10) and the gate (11) are formed.

Figure 7:
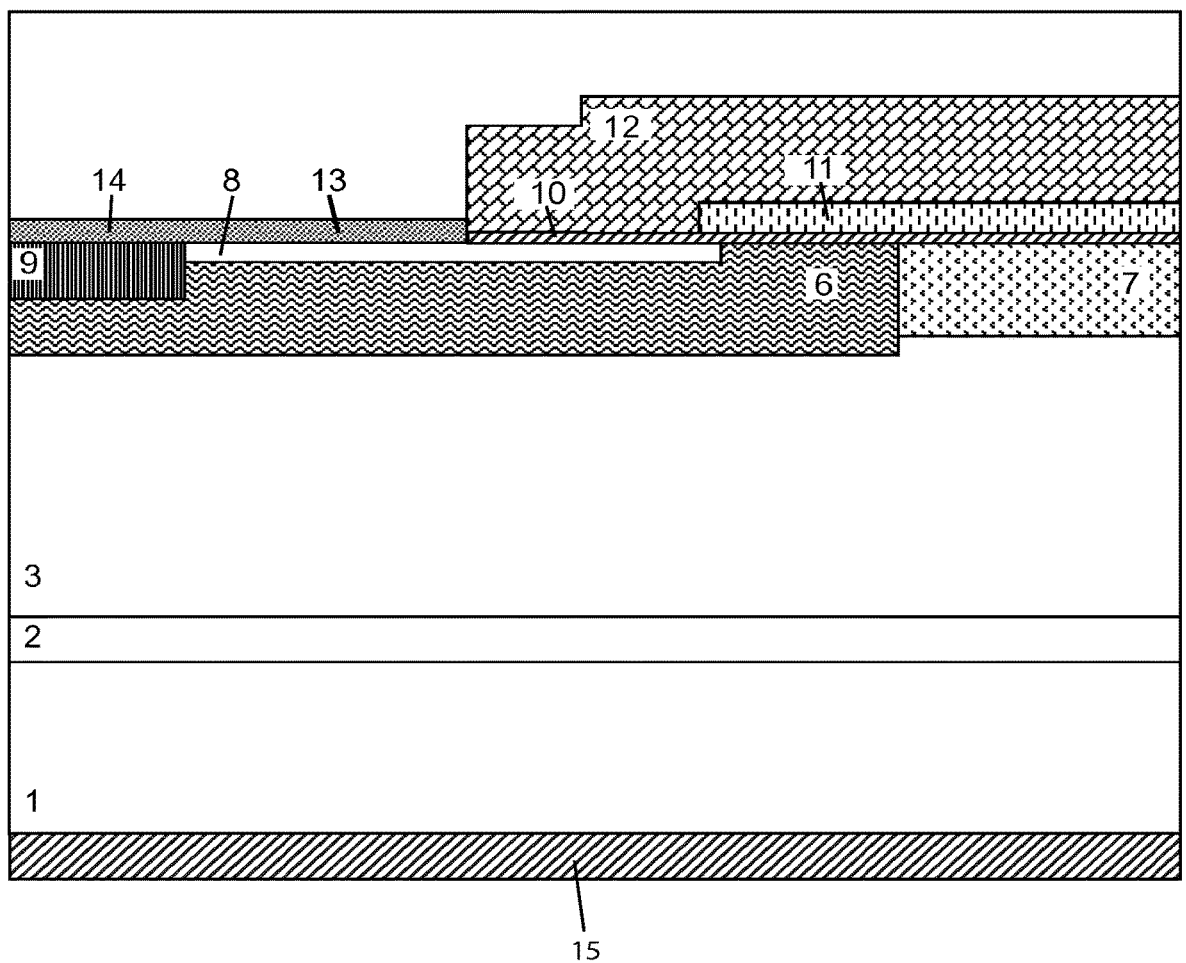
FIG. 7 shows a cross section of a unit cell of a DMOSFET according to the state of the art.

FIG. 7 shows a cross section of a unit cell of a DMOSFET according to the state of the art. There is no p type buried grid. 1-$n+$ substrate, 2-$n+$ buffer layer, 3-$n$ drift layer, 6-p-well, 7-$n$ type JFET area, 8-$n+$ source, 9-$p+$ contact area, 10-gate oxide, 11-gate contact, 12-passivation layer, 13-source contact, 14-body diode contact, 15-drain contact+ thick metallization, 16-thick metallization.

Figure 8B:
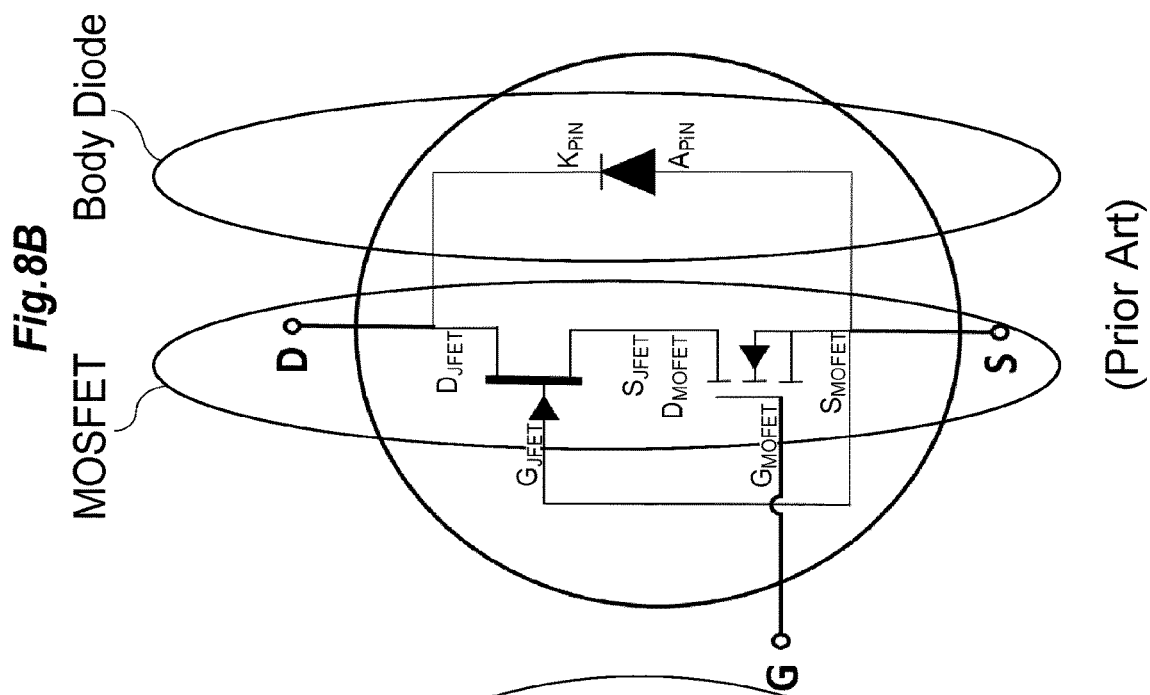
FIGS. 8A-8B show the DMOSFET from FIG. 7 according to the state of the art.
Figure 8A:
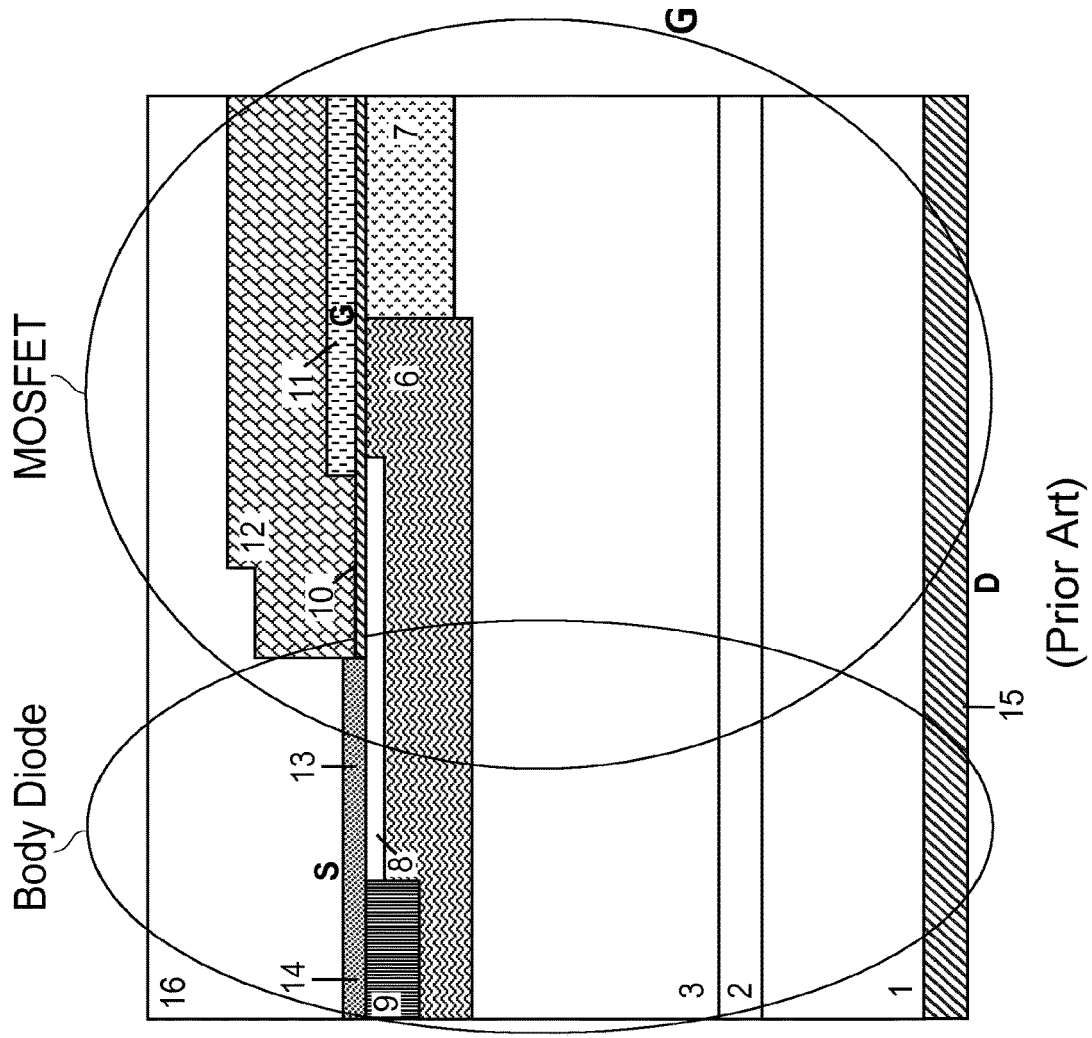

FIGS. 8A-8B show the DMOSFET from FIG. 7 according to the state of the art with indicated areas for the body diode and the MOSFET. An electrical model is shown as well.

Figure 9:
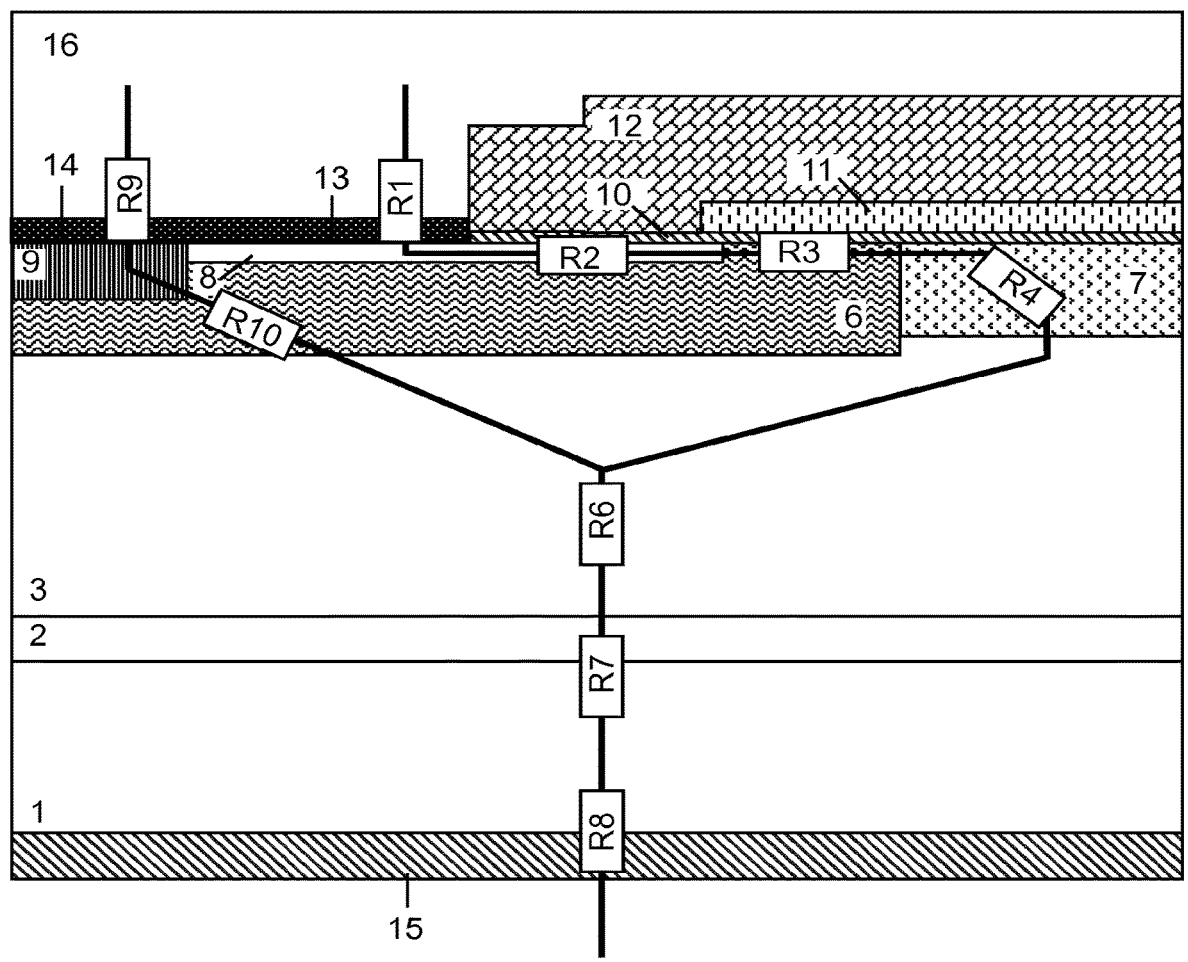
FIG. 9 shows a resistance model of the DMOSFET from FIG. 7 according to the state of the art.

FIG. 9 shows a resistance model of the DMOSFET from FIG. 7 according to the state of the art. The MOSFET and the PN body diode share the same drift to drain area. For the MOSFET: $R_{total,MOS}$=R1+R2+R3+R4+R6+R7+R8. R1-Source contact resistance, R2-Source to MOS channel resistance, R3-MOS channel resistance, R4-JFET resistance, R6-Drift resistance, R7-Substrate+buffer layer resistance, R8-Drain contact resistance. For the PN-Body Diode: $R_{total,pnd}$=R9+R10+R6+R7+R8. R9-P-Body contact resistance, R10-P-well resistance, R6-Drift resistance, R7-Substrate+buffer layer resistance, R8-Drain contact resistance.

Figure 10:
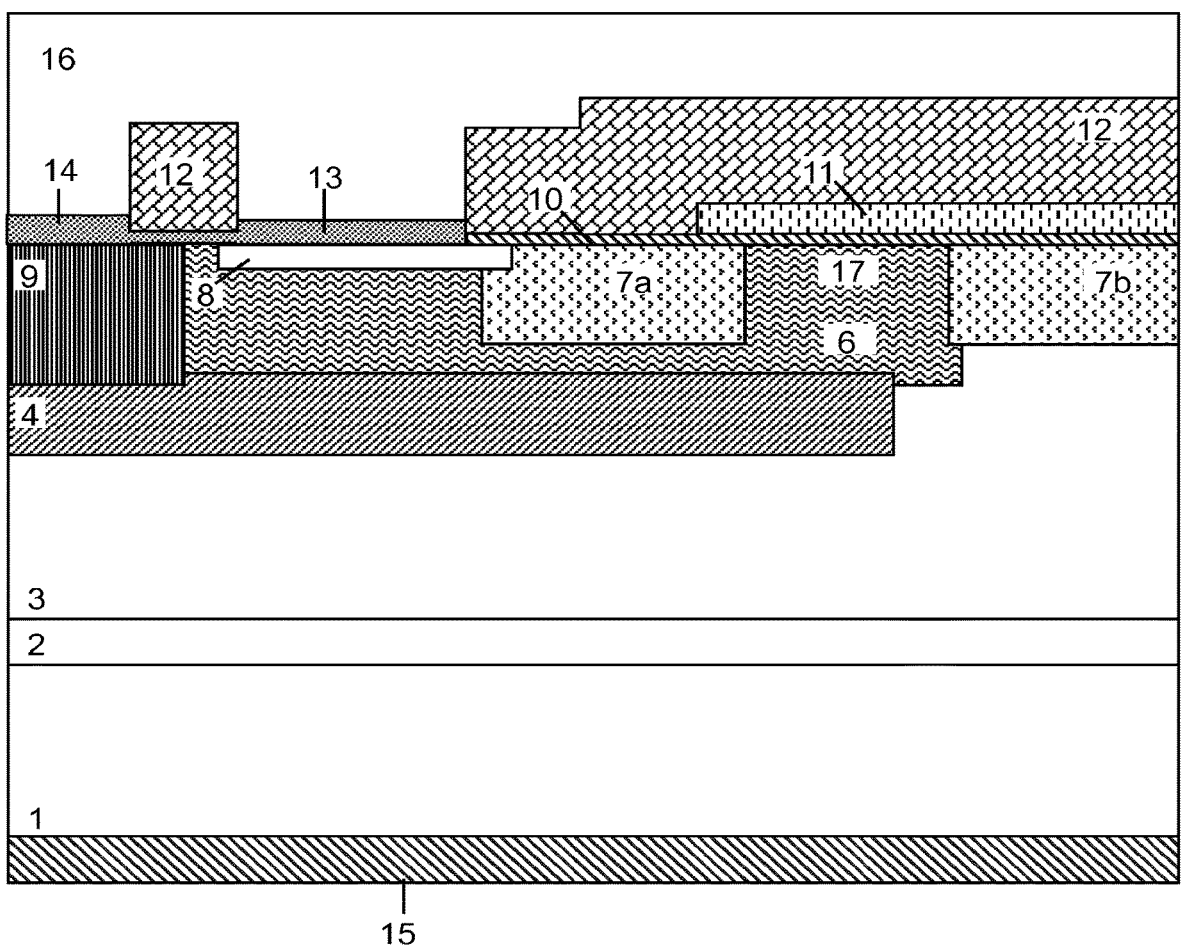
FIG. 10 shows a cross section of a unit cell.

FIG. 10 shows a cross section of a unit cell. A MOSFET and a body diode is shown. In this configuration the p-well region (6) is in direct contact with the buried p+ buried grid (4). 1-$n+$ substrate, 2-$n+$ buffer layer, 3-$n$ drift layer, 4-$p$ type buried grid, 5-$n$ regrown layer, 6-p-well, 7-simultaneously formed n type regions. The simultaneously formed n type regions 7 are made of 7a-access region and 7b-JFET region. 8-$n+$ source, 9-$p$ body, 10-gate oxide, 11-gate contact, 12-isolation layer, 13-source contact, 14-body diode contact, 15-drain contact+thick metallization, 16-thick metallization, In this case, the depth of the access region (7a) is the same as the depth of the JFET region (7b).

Figure 11B:
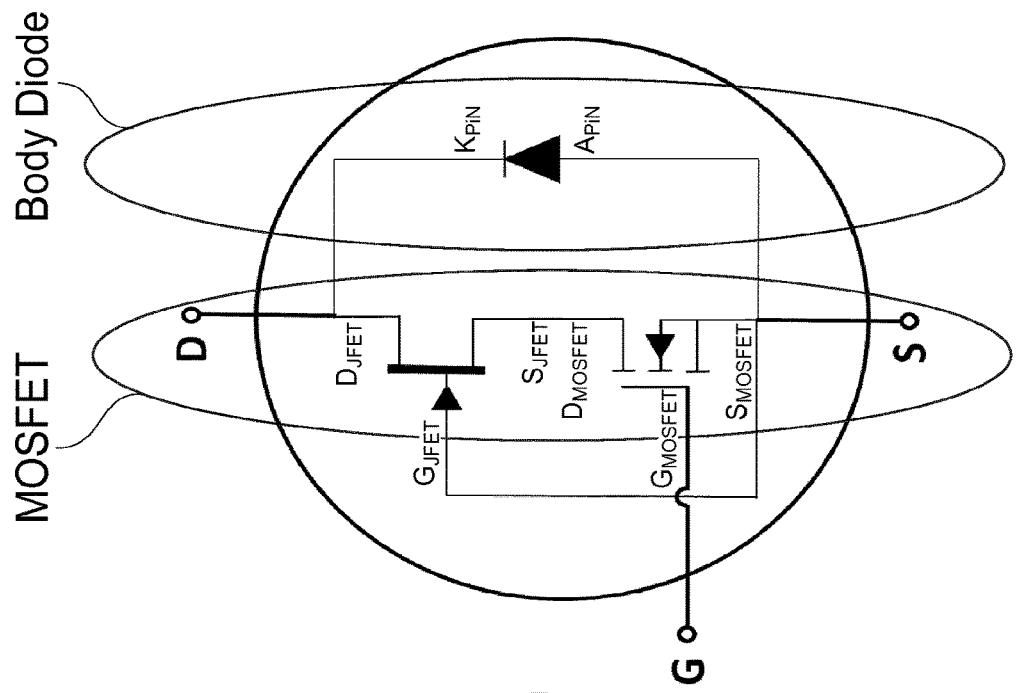
FIGS. 11A-11B show an electrical model of the body diode and MOSFET according to FIG. 10.
Figure 11A:
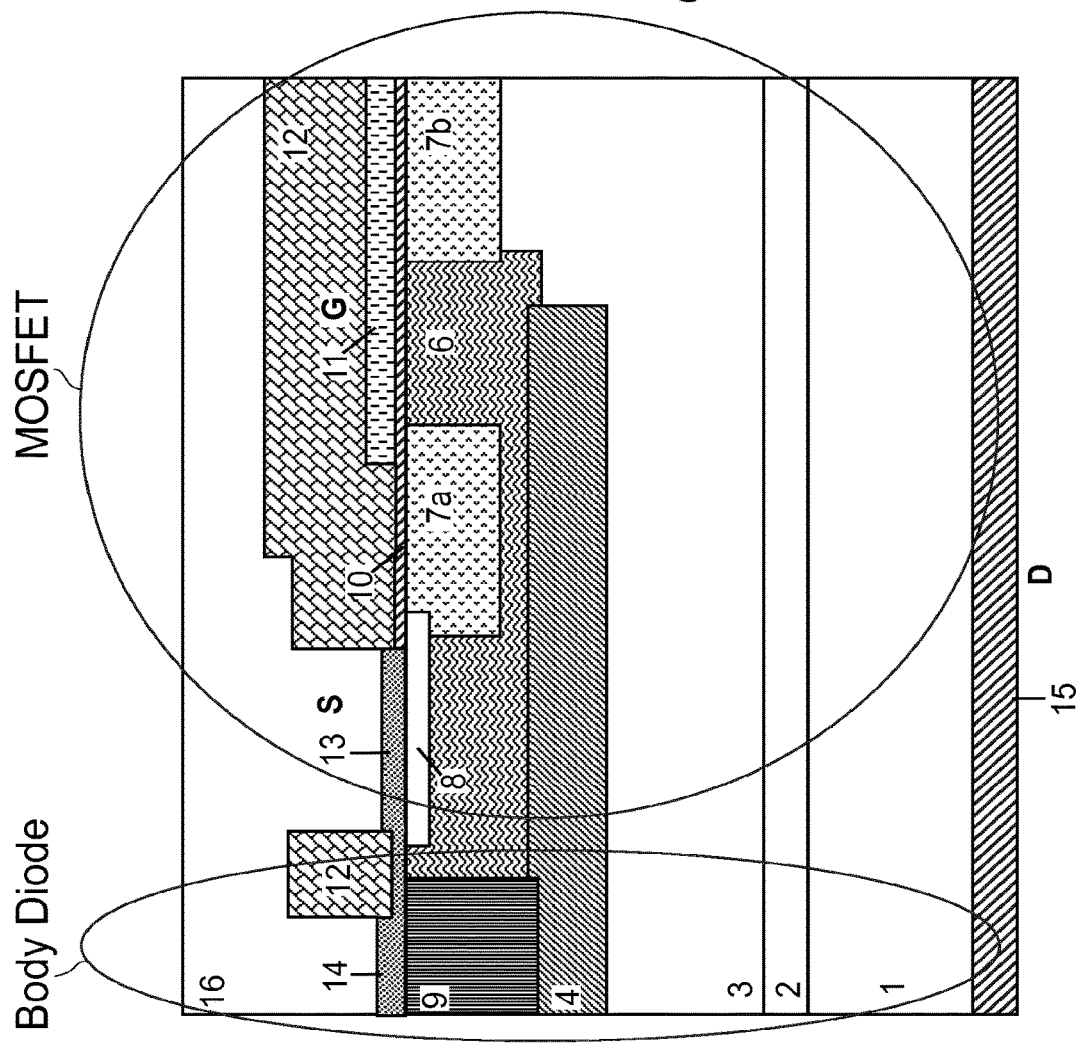

FIGS. 11A-11B show an electrical model of the body diode and MOSFET according to FIG. 10. The source (S), gate (G) and drain (D) are indicated. The shaded areas show the body diode and the MOSFET. An electrical model is shown as well.

Figure 12:
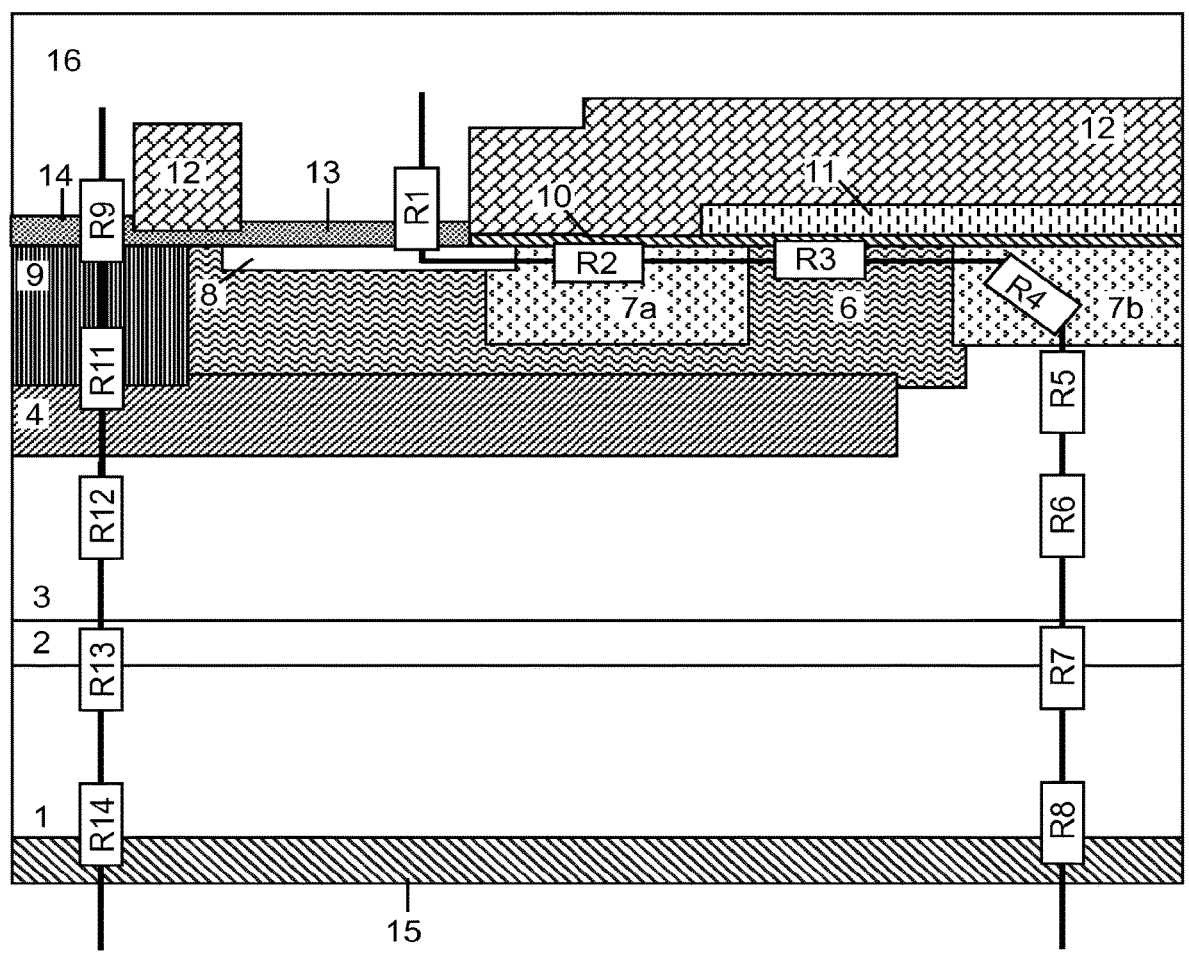
FIG. 12 shows the cross section of a MOSFET unit cell with a resistance model.

FIG. 12 shows the cross section of a MOSFET unit cell with a resistance model. $R_{totalMOS}$=R1+R2+R3+R4+R5+ R6+R7+R8, R1-Source contact resistance, R2-Source to MOS channel access resistance, R3-MOS channel resistance, R4-JFET resistance, R5-Buried grid channel resistance, R6-Drift resistance, R7-Substrate+buffer layer resistance, R8-Drain contact resistance. Also the resistance of the PN body diode is shown: $R_{totalpnd}$=R9+R10+R11+R12+ R13+R14. R9-P-Body contact resistance, R11-P-body+p-grid resistance, R12-Drift Resistance, R13-Substrate+buffer layer resistance, R14-Drain contact resistance. As can be seen the MOSFET and the PN body diode do not share the same drift to drain area and hence the drift to drain resistances are generally different.

Figure 13:
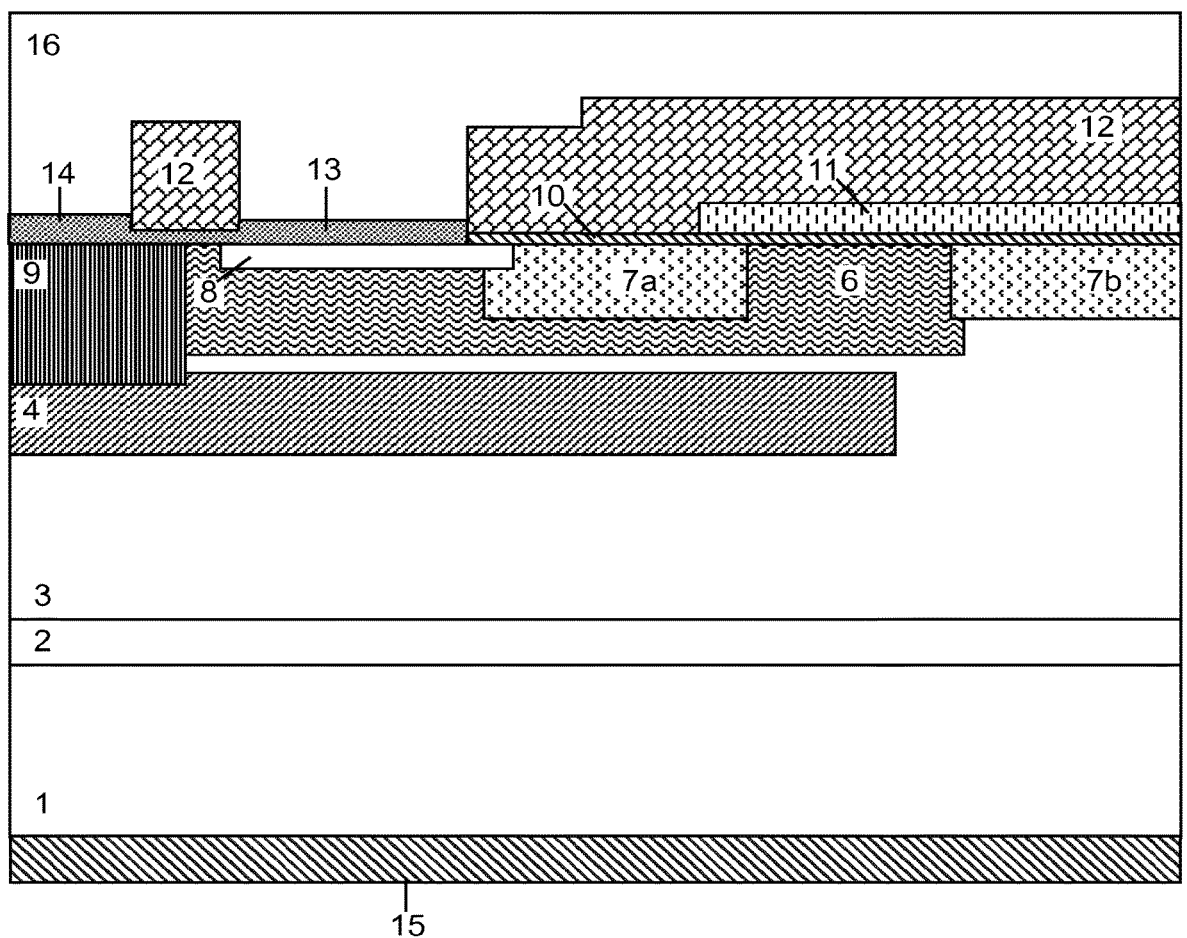
FIG. 13 shows the cross section of a unit cell similar to FIG. 10.

FIG. 13 shows the cross section of a unit cell similar to FIG. 10, but the p-type buried grid (4) is not in direct contact with the p-well (6), the p-type buried grid (4) is in contact with the p-body (9) forming a connection of the p-well (6) and the p-type buried grid (4).

Figure 14B:
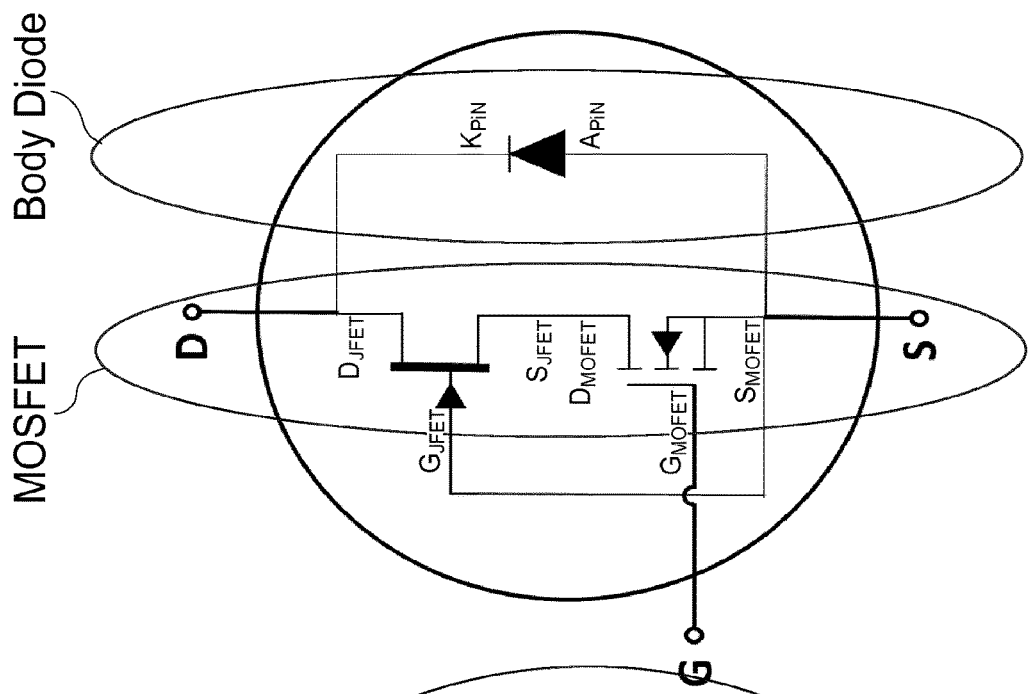
FIGS. 14A-14B show the cross section of a unit cell for the embodiment of FIG. 13.
Figure 14A:
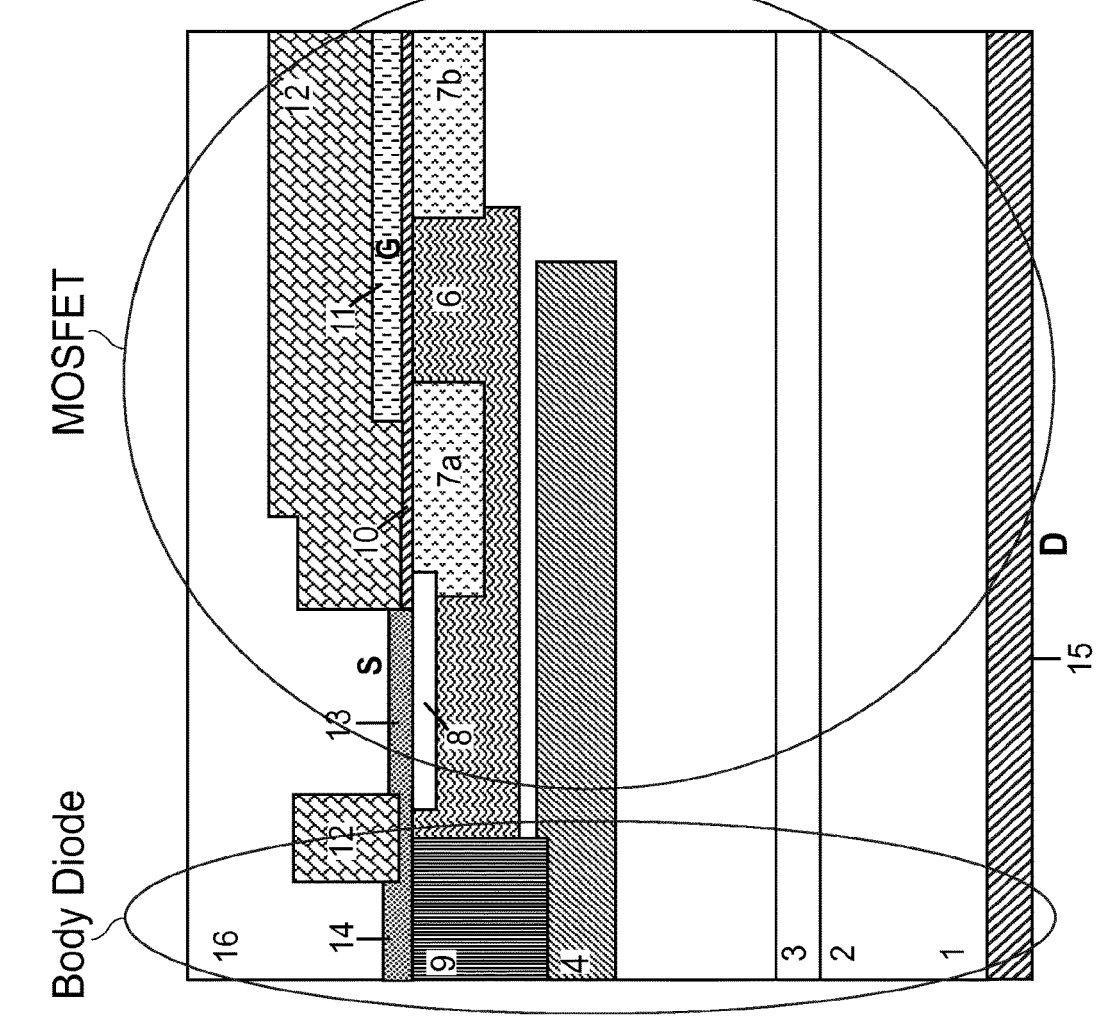

FIGS. 14A-14B show the cross section of a unit cell for the embodiment of FIG. 13, where the areas of the body diode and the MOSFET respectively are shown together with the source (S), gate (G) and drain (D). An electrical model is also shown.

Figure 15:
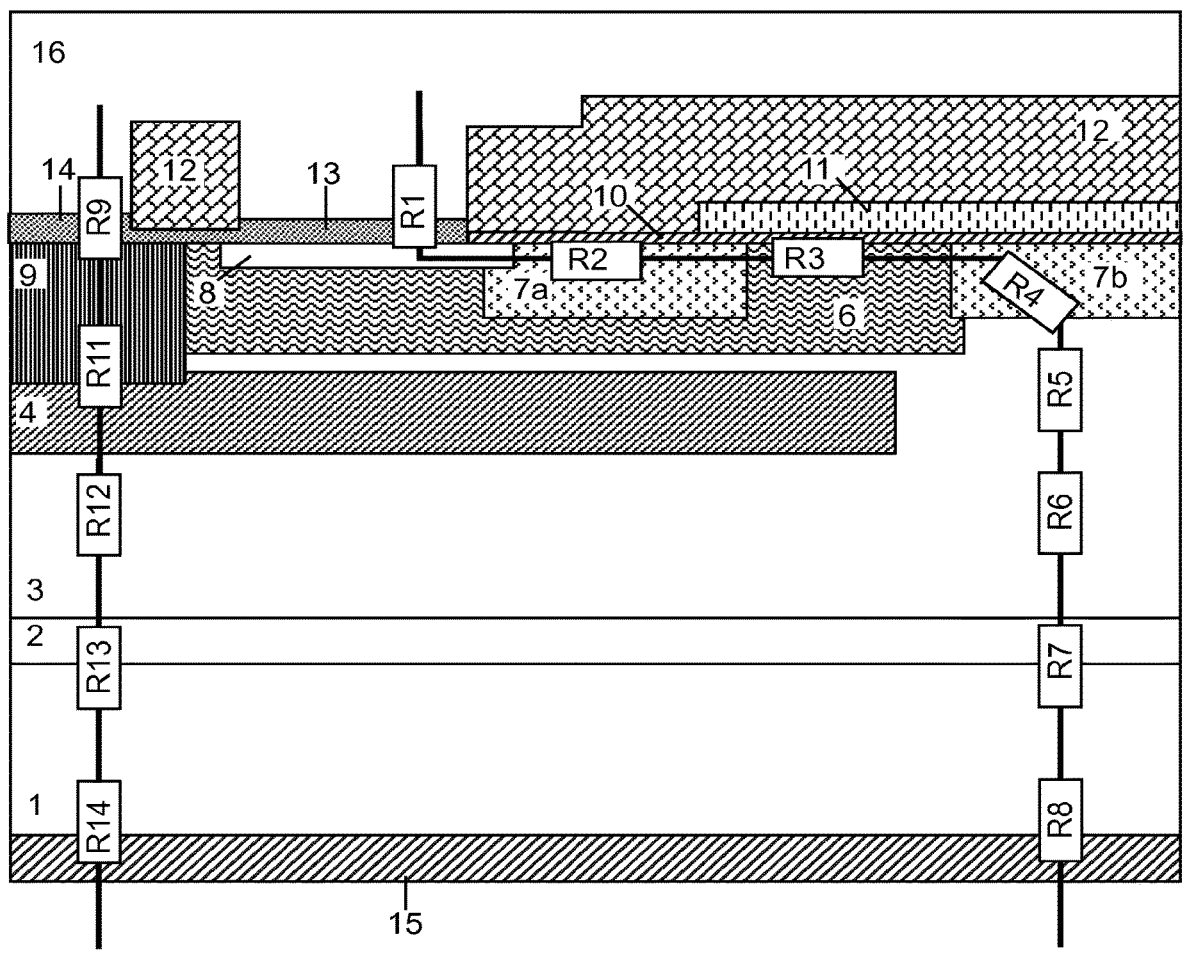
FIG. 15 shows a resistance model of the embodiment in FIG. 13.

FIG. 15 shows a resistance model of the embodiment in FIG. 13. $R_{totalMOS}$=R1+R2+R3+R4+R5+R6+R7+R8, R1-Source contact resistance, R2-Source to MOS channel access resistance, R3-MOS channel resistance, R4-JFET resistance, R5-Buried grid channel resistance, R6-Drift resistance, R7-Substrate+buffer layer resistance, R8-Drain contact resistance. Also the resistance of the PN body diode is shown: $R_{totalpnd}$=R9+R10+R11+R12+R13+R14. R9-P-Body contact resistance, R11-P-body+p-grid resistance, R12-Drift resistance, R13-Substrate+buffer layer resistance, R14-Drain contact resistance. As can be seen the MOSFET and the PN body diode do not share the same drift to drain area and hence the drift to drain resistances are generally different.

Figure 16:
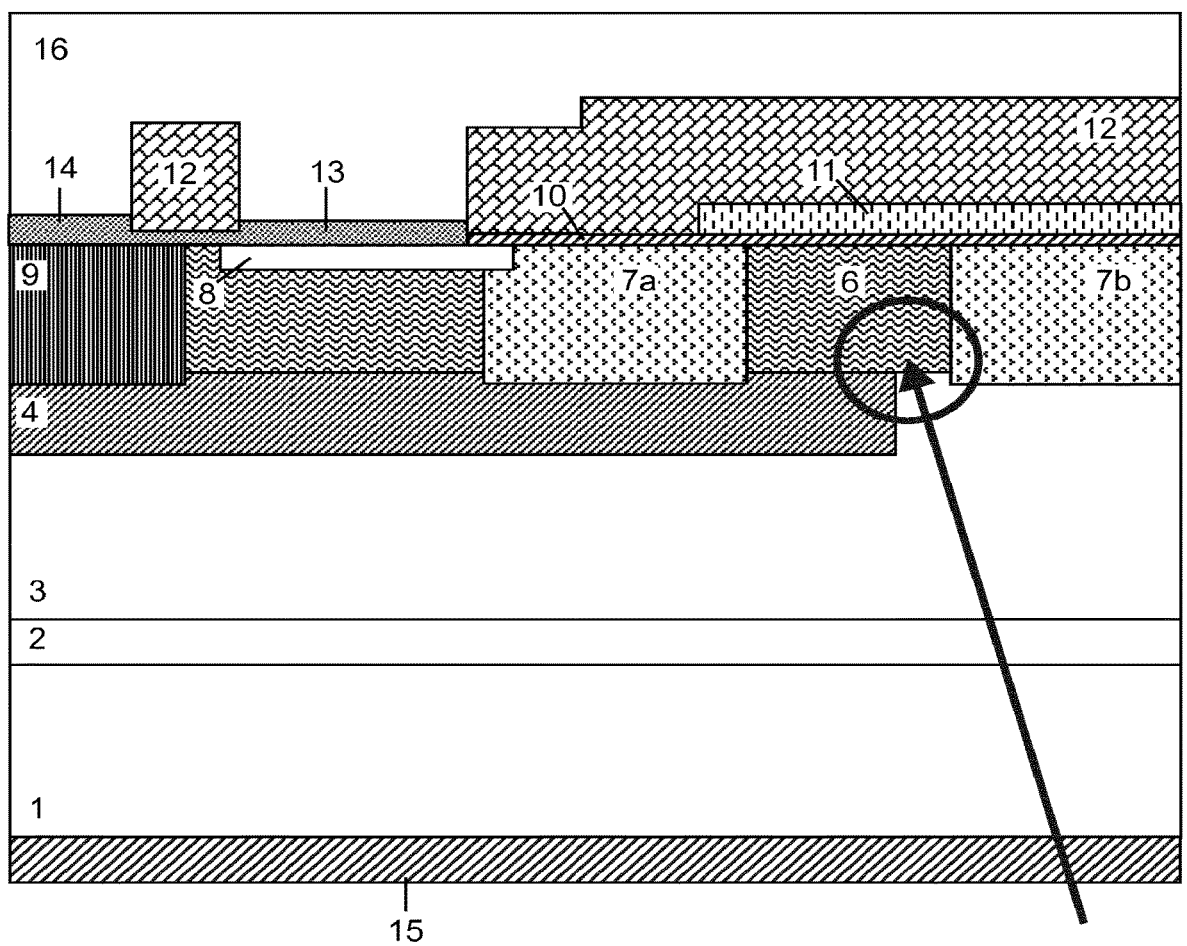
FIG. 16 shows a comparative embodiment where the p-well (6) is manufactured with epitaxy.

FIG. 16 shows a comparative embodiment where the p-well (6) is manufactured with epitaxy, but the regions 7a and 7b are manufactured involving ion implantation. This embodiment is not according to the invention. It shows the critical point indicated by an arrow and a circle. If the concentration in the bottom part of the p-well (6) is too low, the depletion region of the pn-junction can in blocking extend to the source (8) through the access region (7a) or the channel underneath the gate (10+11). This punch through needs to be avoided.

Figure 17:
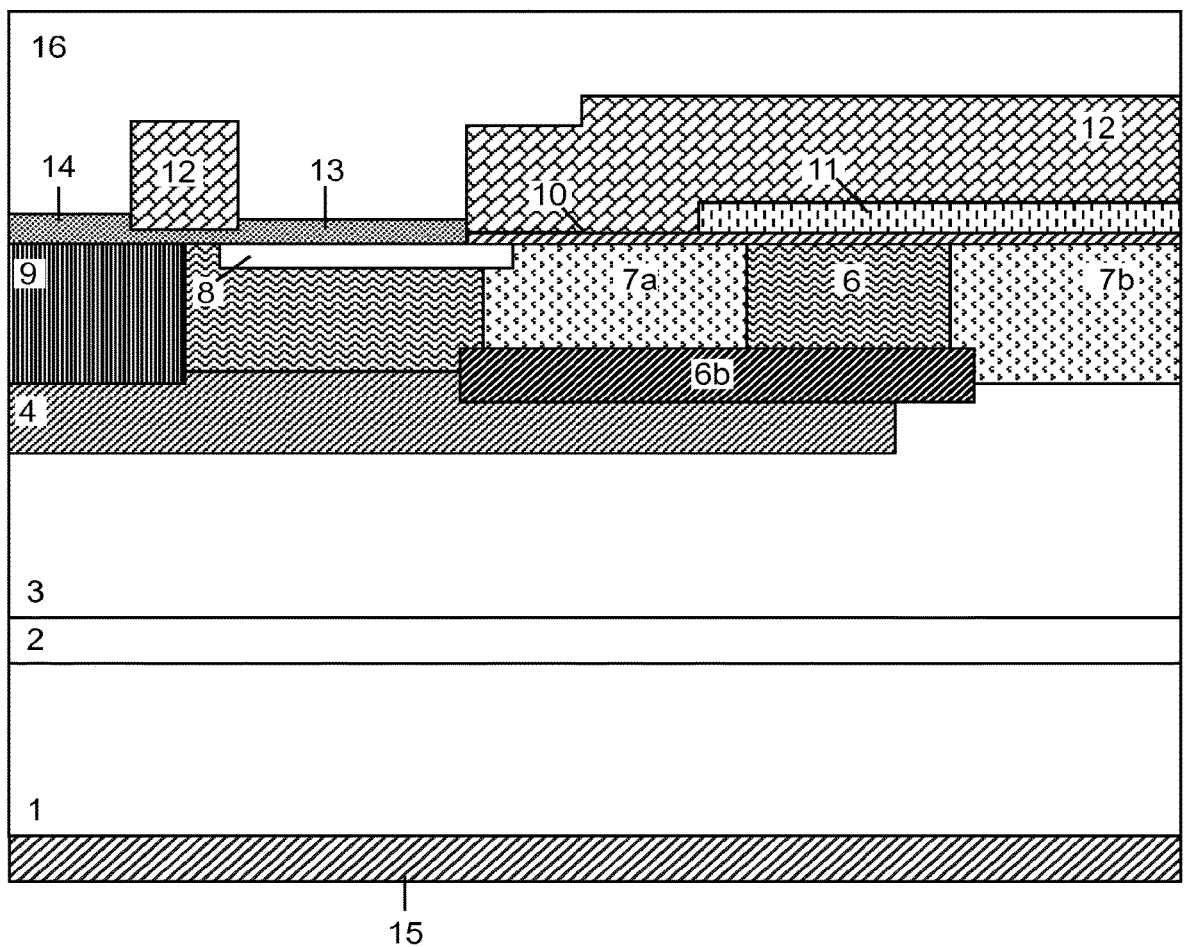
FIG. 17 shows an embodiment according to the invention.

FIG. 17 shows an embodiment according to the invention, where the p-well (6) is manufactured involving epitaxy and ion implantation. Between the n drift layer (3) on one side and a region consisting of the p-well (6), as well as the access region (7a) on the other side, there is at least one from a p type buried grid (4) and a p-well implant (6b). As can be seen, between the access region (7a) and the n drift layer (3) there is both a p type buried grid (4) and a p-well implant (6b). The p-well implant (6b) is manufactured involving ion implantation. Between the p-well (6) and the n-type drift layer (3), there is partly both a p type buried grid (4) and a p-well implant (6b) and partly only a p-well implant (6b).

Figure 18:
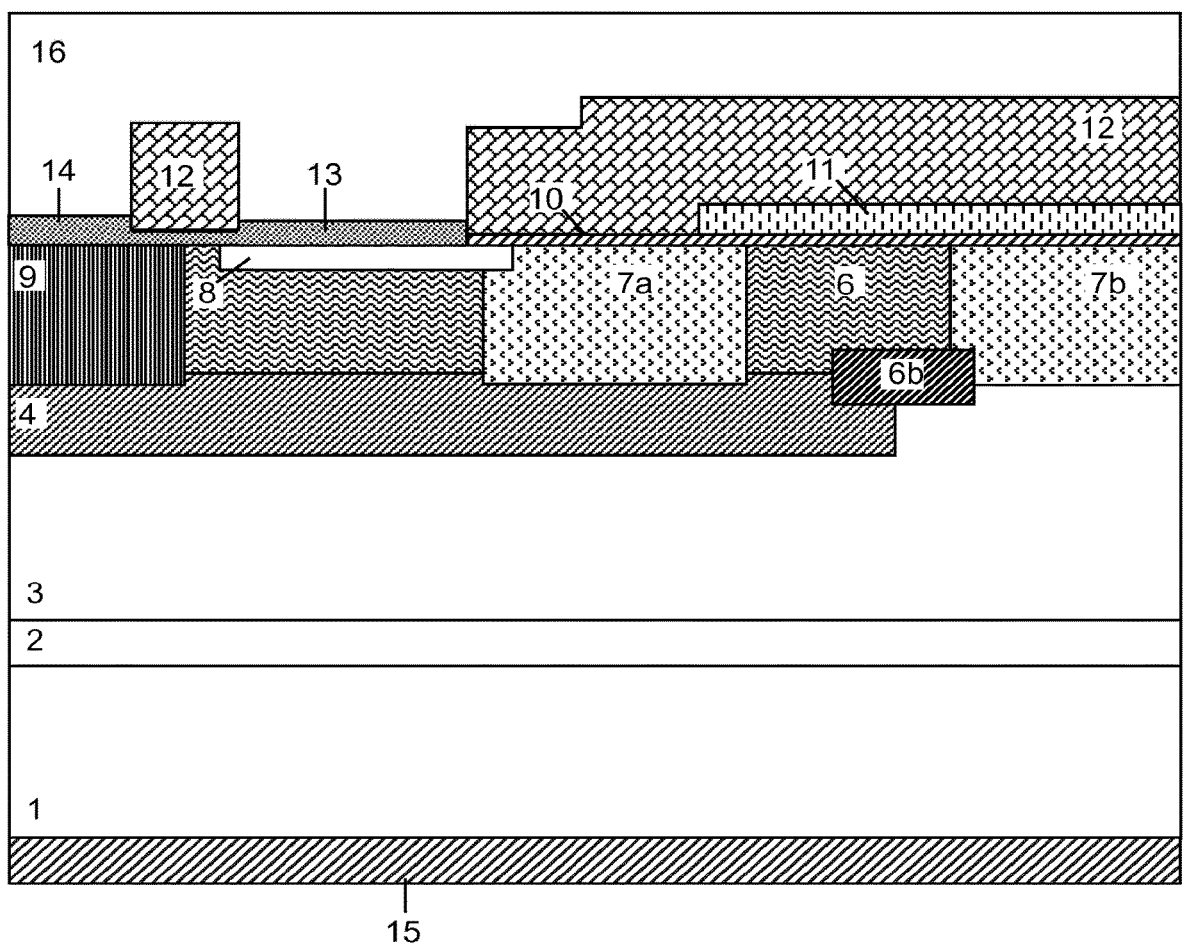
FIG. 18 shows an alternative embodiment according to the invention.

FIG. 18 shows an alternative embodiment according to the invention, where the depth of the p-well (6) is thinner than the depth of the simultaneous formed n-type regions (7). The embodiment of FIG. 18 is manufactured in the same way as the embodiment in FIG. 17. The p type buried grid (4) is not covering the entire area between the p-well (6) and the n drift layer (3). One part of the area is covered by the p-well implant (6b) in contact with the JFET region (7b), the p-grid (4) and the p-well (6). Also in this case there is at least one selected from a p-type buried grid (4) and a p-well implant (6b) between the p-well (6) and the n-type drift layer (3).

Figure 19A:
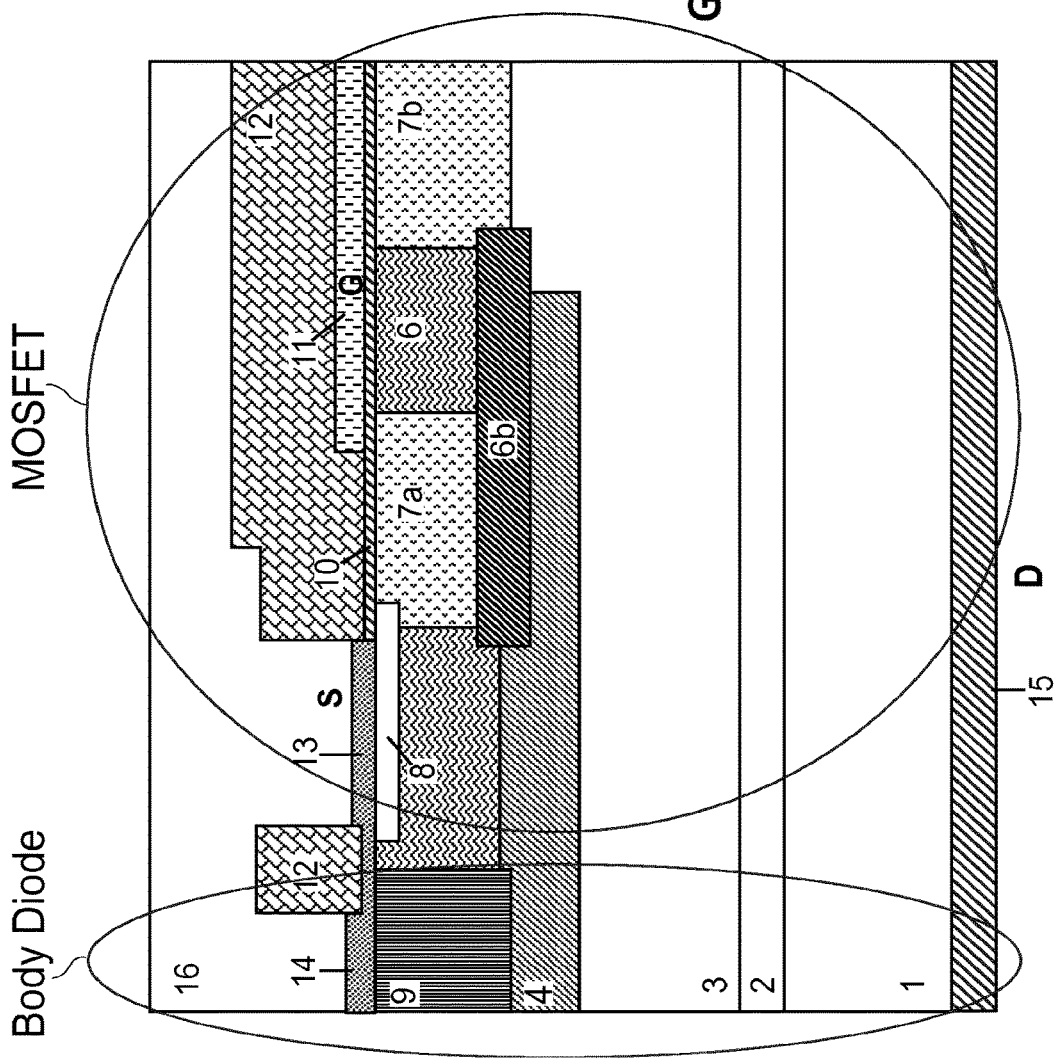
FIGS. 19A-19B show the cross section of a unit cell for the embodiment of FIG. 17.
Figure 19B:
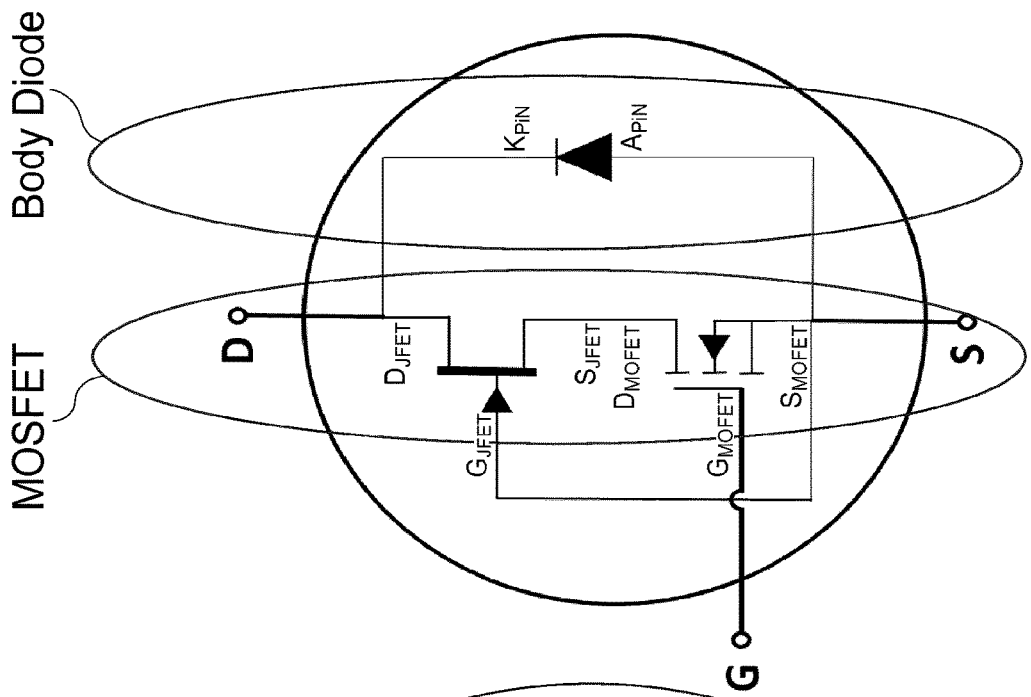

FIGS. 19A-19B show the cross section of a unit cell for the embodiment of FIG. 17, where the areas of the body diode and the MOSFET respectively are shown together with the source (S), gate (G) and drain (D). An electrical model is also shown.

Figure 20:
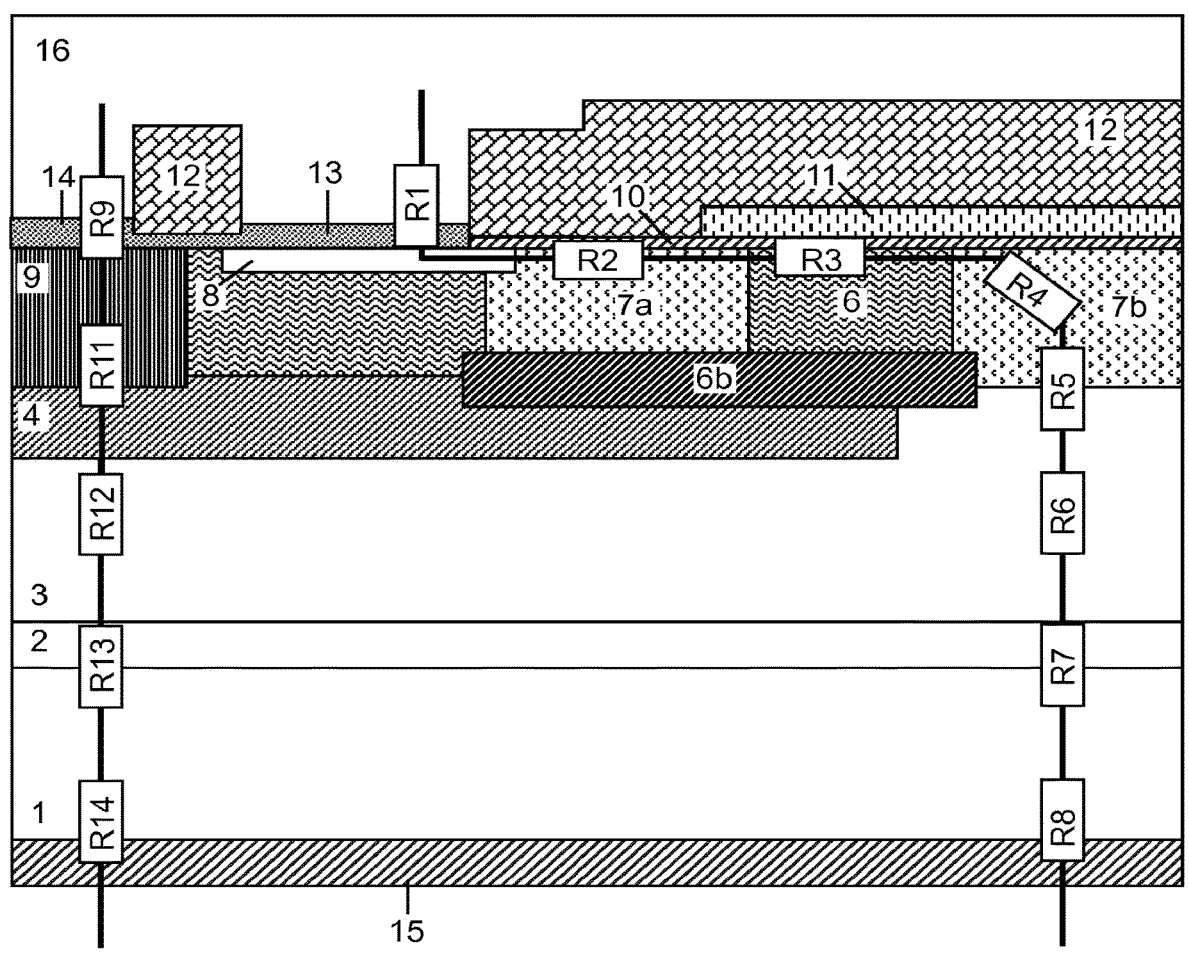
FIG. 20 shows a resistance model of the embodiment in FIG. 17.

FIG. 20 shows a resistance model of the embodiment in FIG. 17. $R_{totalMOS}$=R1+R2+R3+R4+R5+R6+R7+R8, R1-Source contact resistance, R2-Source to MOS channel access resistance, R3-MOS channel resistance, R4-JFET resistance, R5-Buried grid channel resistance, R6-Drift resistance, R7-Substrate+buffer layer resistance, R8-Drain contact resistance. Also the resistance of the PN body diode is shown: $R_{totalpnd}$=R9+R10+R11+R12+R13+R14. R9-P-Body contact resistance, R11-P-body+p-grid resistance, R12-Drift Resistance, R13-Substrate+buffer layer resistance, R14-Drain contact resistance. As can be seen the MOSFET and the PN body diode do not share the same drift to drain area and hence the drift to drain resistances are generally different.

Figure 21A:
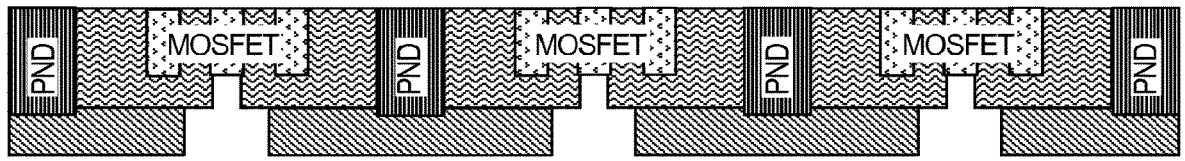
FIGS. 21A-21C shows different ways of arranging MOSFET cells and PN body diode cells according to the invention.
Figure 21B:
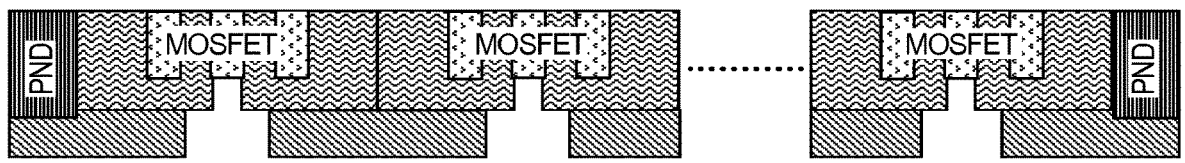
Figure 21C:

FIGS. 21A-21C show different ways of arranging MOSFET cells and PN body diode cells according to the invention. In the upper panel an embodiment where there is one MOSFET cell between adjacent PN body diodes. In the middle panel, there are more than one MOSFET cells between adjacent PN body diodes. In the bottom panel an embodiment according to the prior art is shown where each MOSFET cell has a PN body diode contact.

Before the invention is disclosed and described in more detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise. If nothing else is defined, any terms and scientific terminology used herein are intended to have the meanings commonly understood by those of skill in the art to which this invention pertains.

To be in contact as used herein in connection with regions and objects means that they are in physical contact with each other. If the regions are conductive this implies that there is an electrical contact as well.

MOSFET is used to denote a metal oxide semiconductor field effect transistor. The PN body diode part is included in the term MOSFET unless where the MOSFET is indicated separate next to the PN body diode such as in FIGS. 8A-8B, 11A-11B, 14A-14B, and 19A-19B.

In a first aspect there is provided a method of manufacturing a MOSFET with lateral channel in SiC, said DMOSFET comprising: an n+ substrate (1), an n drift layer (3) in contact with the n+ substrate (1), a p type buried grid (4) in contact with the n drift layer (3), a p-well (6), simultaneously formed n type regions (7), an n+ source (8), a p body (9) in contact with the p-well (6) and the p type buried grid (4), an insulating gate oxide (10), a gate contact (11) on the insulating gate oxide (10), an isolation layer (12) on the gate contact (11), a source contact (13) in contact with the n+ source (8), a body diode contact (14) in contact with the p body (9), a drain contact (15) in contact with the n+ substrate (1), wherein the simultaneously formed n type regions (7) comprises an access region (7a) and a JFET region (7b) with a part of the p-well (6) between the access region (7a) and the JFET region (7b) defining a MOS channel (17), wherein the access region (7a) is in contact with the n+ source (8), wherein the JFET region (7b) is in contact with the n drift layer (3), or an optional n layer (5) between the n drift layer (3) and the JFET region (7b), wherein the access region (7a) and the JFET region (7b) in the simultaneously formed n type regions (7) are formed by ion implantation by using one masking step, wherein one of the following steps is carried out:
  i. the p-well (6) is made by a process involving ion implantation and the simultaneously formed n type regions (7) are implanted to such a depth that a part of the p-well (6) under the access region (7a) remains, or ii. the p-well (6) is made by epitaxial growth not involving ion implantation, wherein at least one selected from a p-well implant (6b) and p type buried grid (4) is between the n drift layer (3) and a region consisting of the p-well (6) as well as the access region (7a).

The MOSFET is manufactured in silicon carbide (SiC). Other materials such as metals and oxides are also used as known in the art to make specific details such as oxide layers and metal layers and metal contacts.

When the p-well (6) is made by ion implantation, i.e. the manufacturing of the p-well (6) includes ion implantation, then a part of the p-well (6) has to remain at least under the access region (7a). "under" in this context means that a part of the p-well (6) is between the access region (7a) and the n drift layer (3) or the optional layer (5). When the p-well (6) is made by epitaxial growth and the manufacturing of the p-well (6) is not involving ion-implantation, then an additional p-well implant (6b) is necessary, if there otherwise would have been a direct contact of the p-well (6) and the n drift layer (3). The p-well implant (6b) protects from punch through, which may happen if there was a direct contact between the p-well (6) and the n drift layer (3). Thus the p-well implant (6b) should be between the p-well (6) and the n drift layer (3) so that there is no direct contact between the p-well (6) and the n drift layer (3). If a p type buried grid (4) is between the p-well (6) and the n drift layer (3), then the p-well implant (6b) might be not needed. The p-well implant (6b) is in contact with the JFET region (7b), the p-grid (4) and the p-well (6). In one embodiment, the p-well implant (6b) has a doping concentration in the interval 5e17-5e18/cm³. The doping concentration of the p-well implant (6b) is preferably adapted so that it overcompensates the access region (7a) and the JFET region (7b). The doping concentration of the p-well implant (6b) is thus preferably higher than in the access region (7a) and the JFET region (7b).

When it is stated that the JFET region (7b) is in contact with the n drift layer (3), it is intended that there may be an optional layer (5) between and in contact with the n drift layer (3) and the JFET region (7b).

The letters p and n denote the conductivity type for the doping, i.e. positive and negative conductivity type respectively. The letter n and p refer to the conductivity type of the layers, areas, or regions, examples include p-well, p-type, n-type, etc. where the letter p and n denote the conductivity type. Although the most common configuration of conductivity type is shown in the different aspects, a skilled person realizes that it is possible to change conductivity type so that p becomes n and n becomes p. Thus also all embodiments where p and n are exchanged are encompassed. It is possible to change all p to n and all n to p in the invention.

The part of the P-well volume between the access (7a) and JFET (7b) regions and closest to the gate oxide (10) is called the MOS channel (17). The length of the MOS channel (17) is defined by the simultaneously formed n-type regions (7) which are added by ion implantation. In the cross section shown in FIG. 10 the length can be seen as the distance across the area (17). In the FIGS. 11A to 20 the MOS channel (17) is not indicated, but is the part of the p-well (6) which is between the access region (7a) and the JFET region (7b) and close to the gate oxide (10). It can be seen that the simultaneous formed n type regions (7) comprises an access region (7a) and a JFET region (7b). Thus 7 denotes both 7a and 7b.

In one embodiment the MOSFET comprises an n+ buffer layer (2).

In one embodiment the MOSFET comprises an n layer (5) between the buried grid (4) and the p-well (6) and in contact with the n drift layer (3) and the JFET region (7b).

In one embodiment the isolation layer (12) also is between the source contact (13) and the body diode contact (14).

In one embodiment the source contact (13) and the body diode contact (14) are connected. In one embodiment the source contact (13) and the body diode contact (14) are connected by a thick metallization (16), In one embodiment the source contact (13) and the body diode contact (14) are not connected.

In one embodiment the p-well (6) is made by epitaxial growth. Under a part of the JFET region (7b), there may or may not be a part of the p-well (6).

In one embodiment the part of the p-well (6) which is not the MOS channel (17) has a doping concentration which is different from the part of the p-well (6) which is the MOS channel (17). The MOS channel (17) is between the access region (7a) and the JFET region (7b). The MOS channel (17) is not explicitly indicated in all drawings. It is indicated in FIG. 10, but exists also in the other embodiments according to the invention such as the ones shown in FIGS. 11A to 20. In one embodiment, the p-well (6) has a higher doping concentration towards the lower part of the p-well (6). This has the advantage that the protection against punch-through becomes even better. This embodiment is suitably made with selective doping of the p-well (6). It can be made by ion implantation of the p-well (6) or by an epitaxial grown p-well (6) combined with ion-implantation of the JFET region (7b).

In one embodiment, the access region (7a) has a doping concentration less than 1e17/cm³. This has the advantage of improving the short-circuit capability of the MOSFET. In one embodiment, the relative doping concentrations of some of the regions are as follows: 6<7a, 7b<6b<4.

It is said that a part is made with ion implantation when ion implantation has been involved in the manufacturing process. If for instance a part is made with epitaxial growth followed by ion implantation, then the part exposed to the ion implantation is said to be made by ion implantation. It is said that a part is made by epitaxy if that part is made by epitaxy but not subjected to ion implantation.

In a second aspect there is provided a MOSFET with lateral channel in SiC, said MOSFET comprising: an n+ substrate (1), an n drift layer (3) in contact with the n+ substrate (1), a p type buried grid (4) in contact with the n drift layer (3), a p-well (6), simultaneously formed n type regions (7), an n+ source (8), a p body (9) in contact with the p-well (6) and the p type buried grid (4), an insulating gate oxide (10), a gate contact (11) on the insulating gate oxide (10), an isolation layer (12) on the gate contact (11), a source contact (13) in contact with the n+ source (8), a body diode contact (14) in contact with the p body (9), a drain contact (15) in contact with the n+ substrate (1), wherein the simultaneously formed n type regions (7) comprise an access region (7a) and a JFET region (7b) with a part of the p-well (6) between the access region (7a) and the JFET region (7b) defining a MOS channel (17), wherein the access region (7a) is in contact with the n+ source (8), wherein the JFET region (7b) is in contact with the n drift layer (3), or an optional n layer (5) between the n drift layer (3) and the JFET region (7b), wherein the access region (7a) and the JFET region (7b) in the simultaneously formed n type regions (7) have the same doping concentration and define the length of the MOS channel (17) with a tolerance of ±50 nm or better,
  wherein the MOSFET satisfies one of:
    i. the p-well (6) is made by a process involving ion implantation and the simultaneously formed n type regions (7) are implanted to such a depth that a part of the p-well (6) under the access region (7a) remains, or
    ii. the p-well (6) is made by epitaxial growth not involving ion implantation, wherein at least one selected from a p-well implant (6b) and the p type buried grid (4) is between the n drift layer (3) and a region consisting of the p-well (6) as well as the access region (7a).

In one embodiment, the length of the MOS channel (17) is defined with a tolerance of ±30 nm or better. The length is the distance between the access region (7a) and the JFET region (7b). The masking step for (7) comprises several process steps affecting the channel length distribution (tolerance) over the wafer, but not so much locally. Within one MOSFET chip, the channel length distribution can be even below 30 nm. In one embodiment the tolerance is ±30 nm or better. In one embodiment the typical length of the MOS channel (17) is in the interval 0.5-1 pm with a tolerance of ±50 nm or better, preferably ±30 nm or better. In one embodiment the tolerance is ±20 nm or better. In one embodiment the tolerance is ±25 nm or better. In one embodiment the tolerance is ±35 nm or better. In one embodiment the tolerance is ±40 nm or better. In one embodiment the tolerance is ±45 nm or better.

The simultaneous formation of access (7a) and JFET (7b) regions shifts the wider resistance distribution from the MOS channel (17) to the access region (7a). The MOSFET performance is less sensitive on access resistance variations. Without it, the resistance distribution is mainly in the MOS channel.

The embodiments of the first aspect are also applicable to the second aspect.

In one embodiment, the access region (7a) between the n+ source (8) and the MOS channel (17) forms together with the MOS channel the dominant part of the MOSFET resistance. The carrier mobility drop with temperature is higher for the moderately doped access region (7a) than for the high doped source (8). Therefore, in comparison with conventional MOSFET structures without access region, the resistance in the access region will increase and the stress of the MOS channel (17) on the gate oxide (10) will be reduced giving an improved short circuit capability (time before breakdown).

The formation process of the self-aligned channel has in one embodiment a p-well with lower doping concentration than in conventional MOSFET designs as the simultaneously formed n type regions (7) on both sides of the channel are limited in doping concentration (JFET-region doping concentration<5e17/cm$^3$) and the p-well doping concentration is in one embodiment overcompensated (p-well doping concentration<JFET-region doping concentration). In addition, low p-well doping concentration in the MOS channel region is preferred due to increased channel mobility. Towards the bottom of the p-well region, the doping concentration increases in one embodiment as high electric field at the edges of the p-well can lead to punch-through, which results in reduced blocking capability and early breakdown of the device. Hence, the embodiment with the proposed MOSFET architecture combines a low-doped p-well with a high doped buried p+-grid, which can be implemented either in contact or separated from the p-well (FIGS. 1 & 2). The buried grid is shielding the sensitive parts of the MOSFET structure such as the gate oxide and the JFET region from high electric field and has high enough doping concentration to avoid punch-through. The combination of low-doped p-well and high-doped buried grid enables a reduction of the on-state resistance of the MOSFET by increasing channel mobility, hence reducing the channel resistance (R3), as well as a reduction of the JFET resistance (R4) and a controllable source to MOS channel access resistance (R2).

The proposed structure benefits from a buried grid, which forms an effective pn body diode for the third quadrant operation of the MOSFET. Therefore, the lower-doped p-well will not participate in the third-quadrant current drive, leading to improved reliability of the device.

In one embodiment there is provided a MOSFET arrangement wherein body diode parts comprising the body diode contact (14), the p body (9) are not repeated in every unit cell so that there are more than one MOSFET between two adjacent body diodes. Such an embodiment is depicted in FIG. 21, middle panel.

The invention claimed is:

1. A method of manufacturing a MOSFET device in SiC, the method comprising:
  forming a drift layer in contact with a substrate, a buried grid in contact with the drift layer, and a well above the buried grid;
  defining a self-aligned lateral MOS channel for a MOSFET circuit by simultaneously forming an access region and a JFET region within the well, the access and JFET regions being laterally self-aligned and having an intermediate part of the well therebetween;
  forming a source in contact with the well and the access region;
  forming a body for a body diode circuit in contact with the well and the buried grid;
  forming a source contact and a body diode contact, the source contact for the MOSFET circuit being in contact with the source, the body diode contact for the body diode circuit being in contact with the body;
  forming an insulating gate oxide on a portion of the source, the access region, the intermediate part of the well, and the JFET region;
  forming a gate contact on the insulating gate oxide, and forming an isolation layer on the gate contact; and
  forming a drain contact in contact with the substrate.

2. The method of claim 1, wherein simultaneously forming the access and JFET regions comprises:
  forming the JFET region in contact with the drift layer; or
  forming the JFET region in contact with an n-type layer between the drift layer and the JFET region.

3. The method of claim 1, wherein simultaneously forming the access and JFET regions comprises performing ion implantation into the well by using one masking step.

4. The method of claim 3, wherein forming the well comprises performing a process involving ion implantation; and wherein simultaneously forming the access and JFET regions by performing the ion implantation into the well comprises implanting to such a depth that a part of the well under the access region remains.

5. The method of claim 3, wherein forming the well comprises performing epitaxial growth not involving ion implantation.

6. The method of claim 5, comprising positioning a well implant between the drift layer and an area having the well and the access region; or positioning the buried grid between the drift layer and the area having the well and the access region.

7. The method of claim 1, wherein forming the drift layer in contact with the substrate comprises including a buffer layer between the substrate and the drift layer.

8. The method of claim 1, wherein forming the isolation layer further comprises forming the isolation layer between the source contact and the body diode contact.

9. The method of claim 1, wherein forming the source contact and the body diode contact comprises:
connecting the source contact and the body diode contact by a metallization; or
forming the source contact and the body diode contact as unconnected.

10. The method of claim 1, wherein forming the well and defining the MOS channel comprises forming a part of the well which is not the MOS channel with a doping concentration that is different from the intermediate part of the well for the MOS channel.

11. The method of claim 1, wherein forming the well comprises forming the well with a higher doping concentration towards a lower part of the well.

12. The method of claim 1, wherein forming the access region comprises forming the access region with a doping concentration less than $1e17/cm^3$.

13. The method of claim 1, wherein:
the substrate is an n+type substrate;
the drift layer is n type drift layer;
the buried grid is a p type buried grid;
the well is a p type well;
the access and JFET regions are n type regions;
the source is an n+type source; and
the body for the body diode circuit is a p type body.

14. A MOSFET with a lateral channel in SiC manufactured according to the method of claim 1.

15. A MOSFET with a lateral channel in SiC, the MOSFET comprising:
a substrate having a drift layer in contact with the substrate, a buried grid in contact with the drift layer, and a well above the buried grid;
a MOS channel defined by simultaneously formed regions comprising an access region and a JFET region within the well that are laterally self-aligned and have an intermediate part of the well disposed therebetween;
a body diode circuit having a body and a body diode contact, the body in contact with the well and the buried grid, the body diode contact in contact with the body;
an insulating gate oxide on a portion of the source, the access region, the intermediate part of the well, and the JFET region;
a gate contact on the insulating gate oxide;
an isolation layer on the gate contact;
a source in contact with the well and the access region;
a source contact for a MOSFET circuit in contact with the source; and
a drain contact in contact with the substrate.

16. The MOSFET of claim 15, wherein the JFET region is in contact with the drift layer or with an n type layer between the drift layer and the JFET region.

17. The MOSFET of claim 15, wherein the access region and the JFET region in the simultaneously formed regions comprise a same doping concentration and define a length of the MOS channel with a tolerance of ±50 nm or less or with a tolerance of ±30 nm or less.

18. The MOSFET of claim 15, wherein the well is made by a process involving ion implantation; and wherein the simultaneously formed regions are implanted to such a depth that a part of the well under the access region remains.

19. The MOSFET of claim 15, wherein the well is made by epitaxial growth not involving ion implantation; and wherein at least one of a p-well implant and the buried grid is disposed between the drift layer and an area having the well and the access region.

20. The MOSFET of claim 15, wherein:
the MOSFET comprises an n+buffer layer between the substrate and the drift layer;
the isolation layer is between the source contact and the body diode contact;
the source contact and the body diode contact are connected by a metallization;
the source contact and the body diode contact are unconnected;
the part of the well which is not the MOS channel has a doping concentration different from the intermediate part of the well for the MOS channel;
the well comprises a higher doping concentration towards a lower part of the well;
the access region has a doping concentration less than $1e17/cm^3$; or more than one MOSFET is disposed between two adjacent ones of the body diodes.

* * * * *